(12) United States Patent
Kim et al.

(10) Patent No.: US 12,727,511 B2
(45) Date of Patent: Sep. 1, 2026

(54) SEMICONDUCTOR LIGHT EMITTING DEVICE PACKAGE FOR DISPLAY PIXEL AND DISPLAY DEVICE INCLUDING THE SAME

(71) Applicant: LG ELECTRONICS INC., Seoul (KR)

(72) Inventors: Myoungsoo Kim, Seoul (KR); Changseo Park, Seoul (KR); Gunho Kim, Seoul (KR); Jungsub Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 355 days.

(21) Appl. No.: 18/232,042

(22) Filed: Aug. 9, 2023

(65) Prior Publication Data

US 2024/0055412 A1 Feb. 15, 2024

(30) Foreign Application Priority Data

Aug. 10, 2022 (KR) ........................ 10-2022-0100097

(51) Int. Cl.
*H10W 90/00* (2026.01)
*H10H 20/01* (2025.01)
(Continued)

(52) U.S. Cl.
CPC ........ *H10W 90/00* (2026.01); *H10H 20/0137* (2025.01); *H10H 20/018* (2025.01);
(Continued)

(58) Field of Classification Search
CPC . H10W 90/00; H10H 20/0137; H10H 20/018; H10H 20/831; H10H 20/032;
(Continued)

(56) References Cited

U.S. PATENT DOCUMENTS 9,825,202 B2 * 11/2017 Schuele ............... H10H 20/831
2007/0170444 A1 7/2007 Cao
(Continued)

FOREIGN PATENT DOCUMENTS

EP 3 483 934 A1 5/2019
EP 3 648 164 A1 5/2020
(Continued)

*Primary Examiner* — Su C Kim
(74) *Attorney, Agent, or Firm* — Birch, Stewart, Kolasch & Birch, LLP

(57) ABSTRACT

Discussed is a semiconductor light emitting device package for a display pixel The semiconductor light emitting device package can include a first semiconductor light emitting device of a first color having a first material and a second semiconductor light emitting device of a second color having a second material disposed on the first semiconductor light emitting device. The first semiconductor light emitting device can include a first semiconductor light emitting structure having an inner recess, and a first-first electrode and first-second electrode layer electrically connected to a first side and a second side of the first semiconductor light emitting structure, respectively. The second semiconductor light emitting device can be disposed in the inner recess of the first semiconductor light emitting device.

17 Claims, 21 Drawing Sheets

(51) Int. Cl.
*H10H 20/831* (2025.01)
*H10H 20/84* (2025.01)

(52) U.S. Cl.
CPC ......... *H10H 20/831* (2025.01); *H10H 20/032* (2025.01); *H10H 20/84* (2025.01)

(58) Field of Classification Search
CPC .... H10H 20/84; H10H 29/24; H10H 29/8421; H10H 29/30; H10H 29/962; H10H 20/819; H10H 29/142; H10H 20/8514; H10H 20/853; H10H 20/856; H10H 20/857; H10H 20/817; H10H 20/825
See application file for complete search history.

(56) References Cited

U.S. PATENT DOCUMENTS

| | | | | |
|---|---|---|---|---|
| 2007/0284566 | A1 | 12/2007 | Tada et al. | |
| 2011/0089444 | A1* | 4/2011 | Yao | H10H 20/833 257/E33.066 |
| 2013/0015473 | A1* | 1/2013 | Chen | H10W 90/00 257/E33.062 |
| 2019/0019816 | A1* | 1/2019 | Kang | H10D 86/60 |
| 2019/0019839 | A1 | 1/2019 | Tian et al. | |
| 2019/0139944 | A1 | 5/2019 | Kim et al. | |
| 2019/0189681 | A1 | 6/2019 | Chae et al. | |
| 2020/0219858 | A1 | 7/2020 | Chang | |
| 2020/0258872 | A1 | 8/2020 | Lee et al. | |
| 2021/0090924 | A1 | 3/2021 | Yang et al. | |
| 2023/0207743 | A1 | 6/2023 | Lee et al. | |

FOREIGN PATENT DOCUMENTS

| | | | |
|---|---|---|---|
| KR | 10-1733225 | B1 | 5/2017 |
| KR | 10-2019-0108769 | A | 9/2019 |
| KR | 10-2022303 | B1 | 9/2019 |
| KR | 10-2323256 | B1 | 11/2021 |
| KR | 10-2417710 | B1 | 7/2022 |
| KR | 10-2601422 | B1 | 11/2023 |
| WO | WO 2022/045580 | A1 | 3/2022 |

* cited by examiner

[FIG. 1]
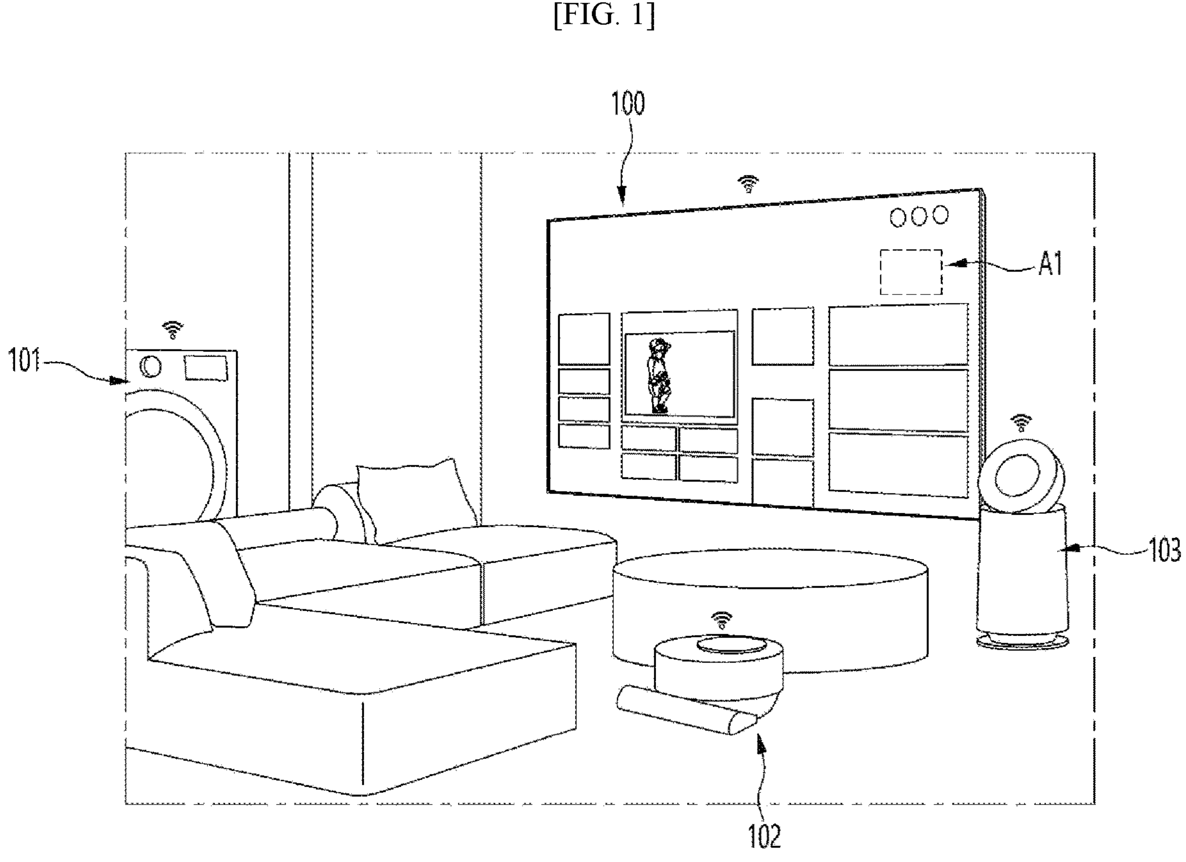

[FIG. 2]
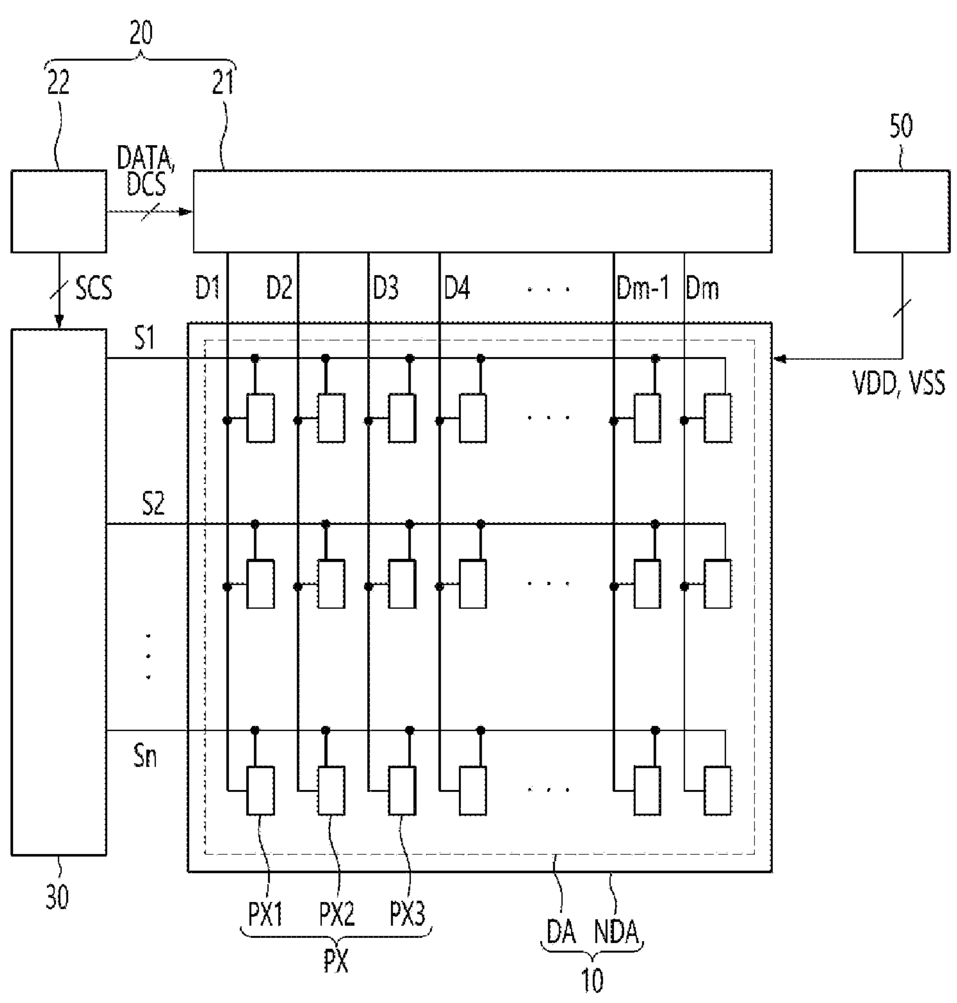

[FIG. 3]
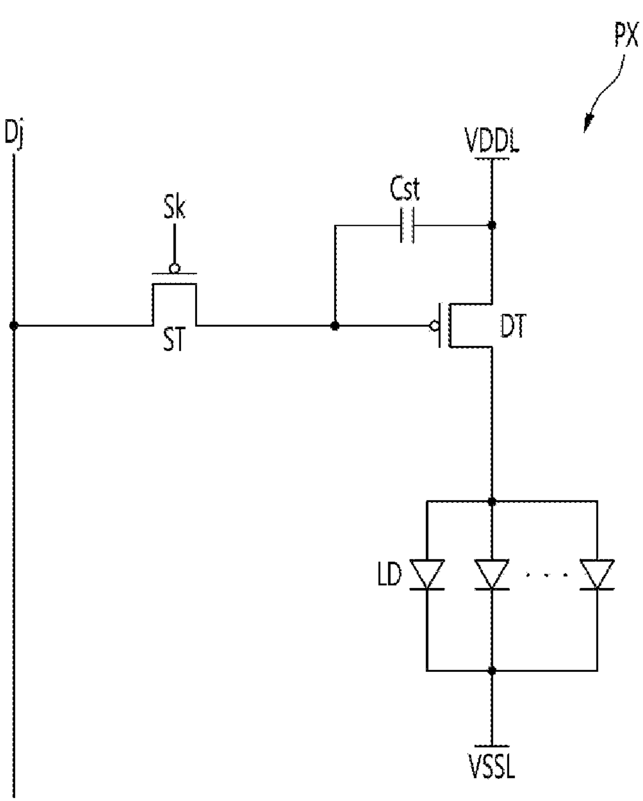

[FIG. 4]
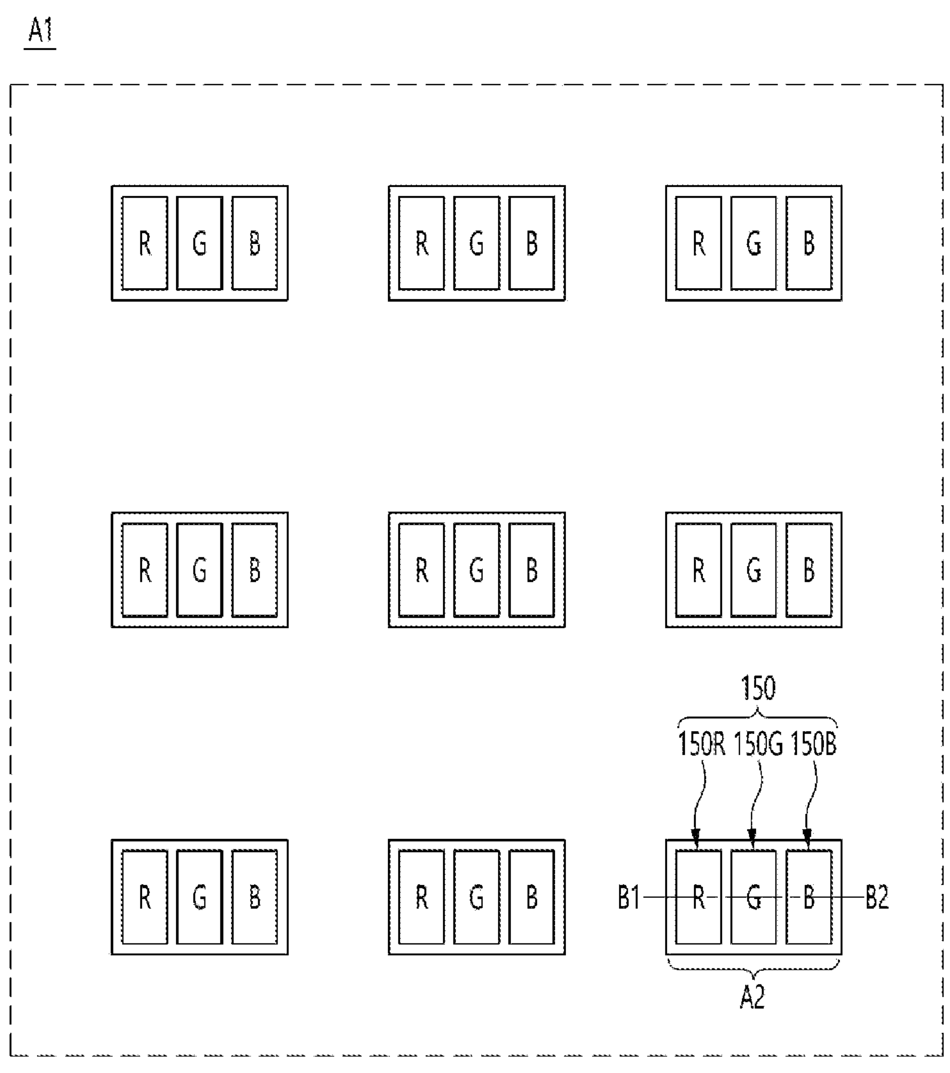

[FIG. 5]
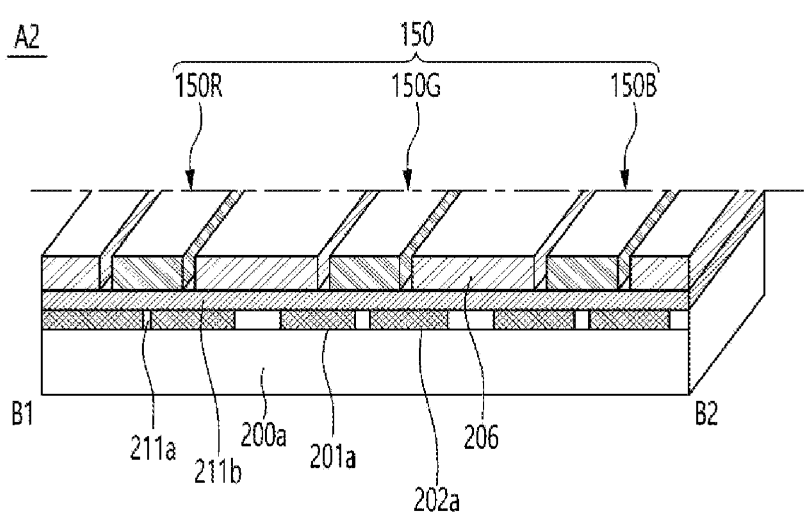
[FIG. 6]
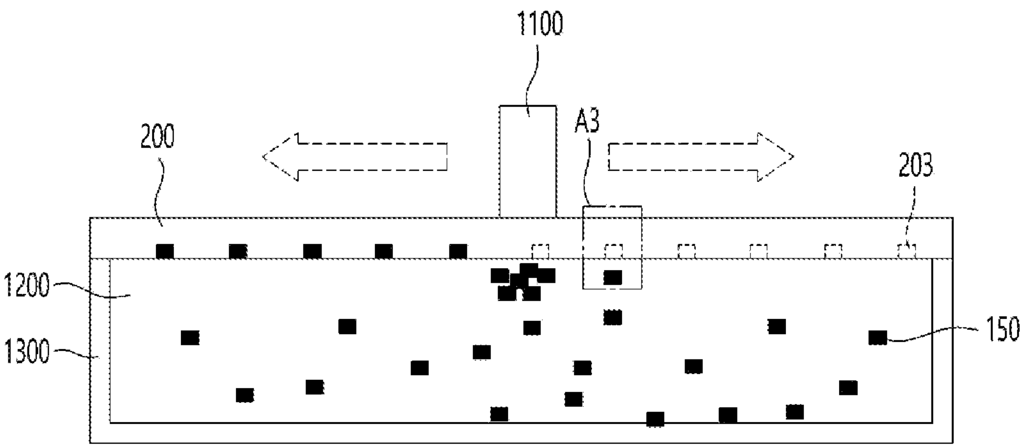

[FIG. 7]

[FIG. 8A]
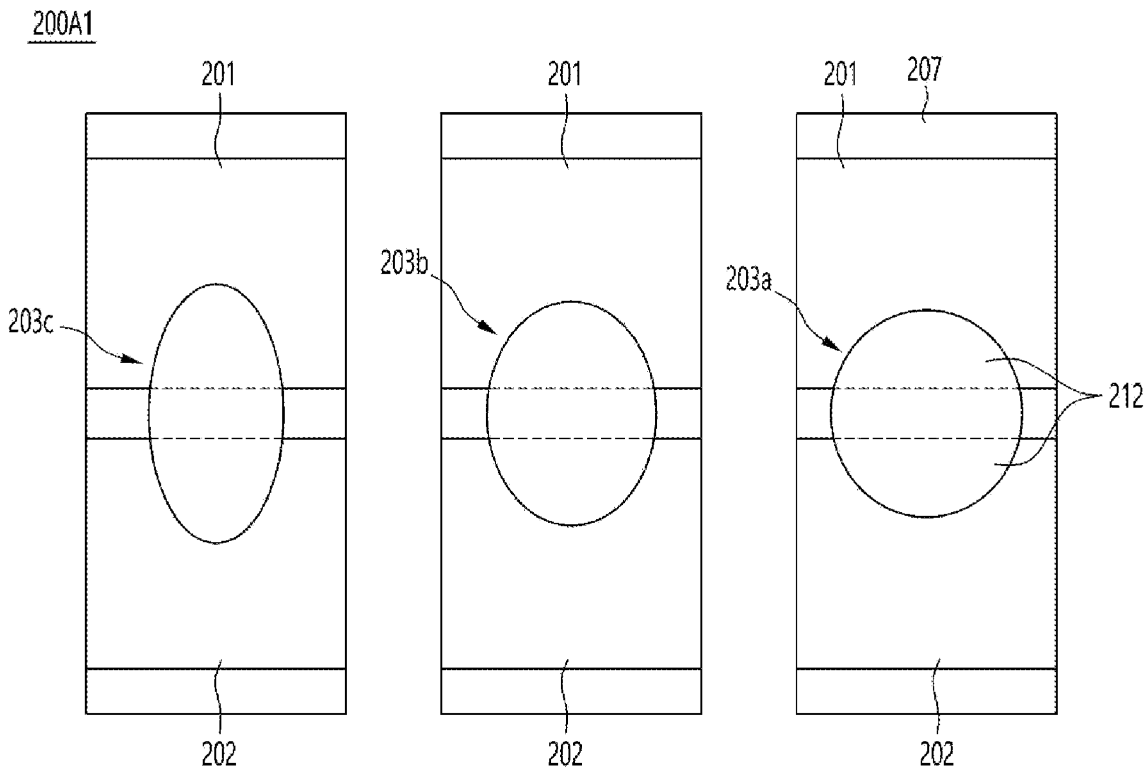

[FIG. 8B]
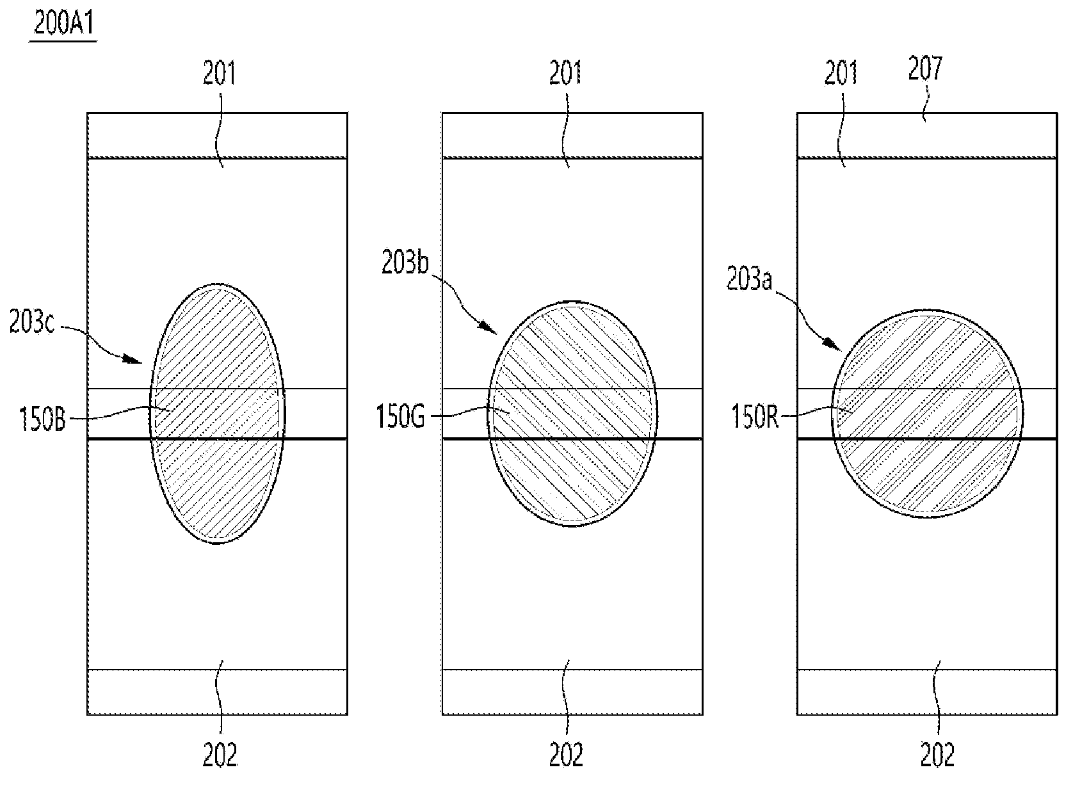
[FIG. 8C]
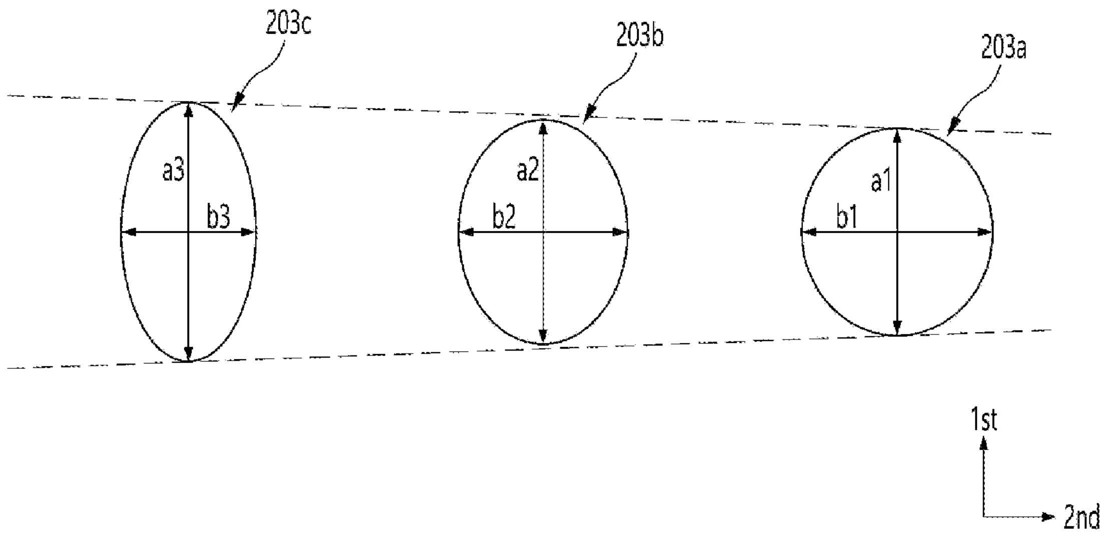

[FIG. 9A]
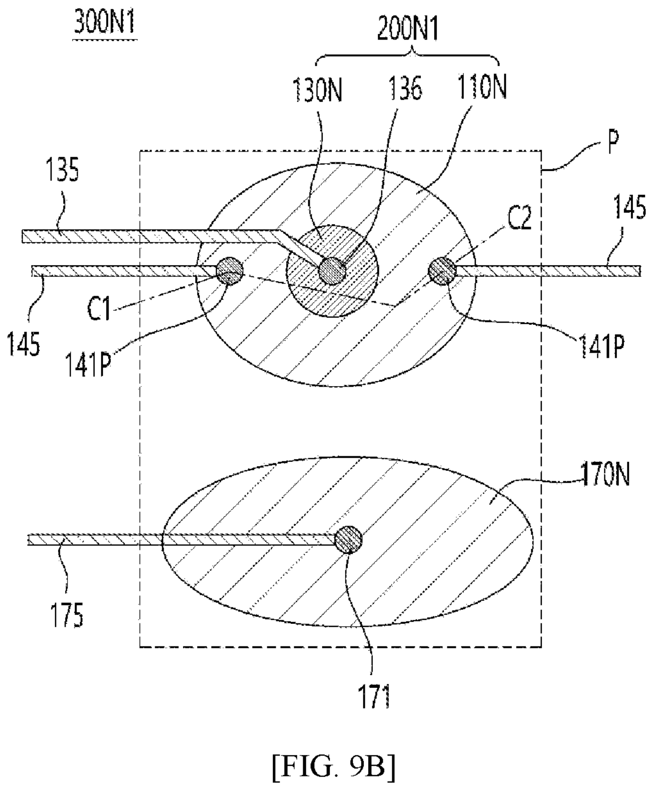
[FIG. 9B]
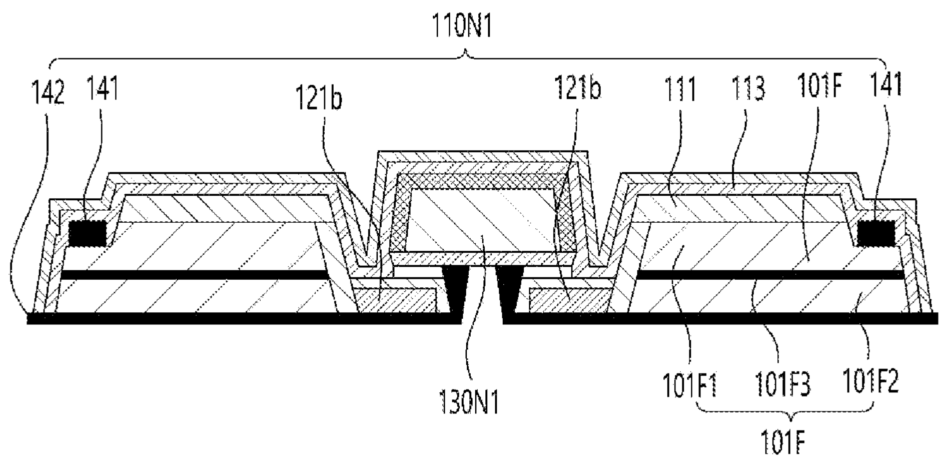

[FIG. 10A]
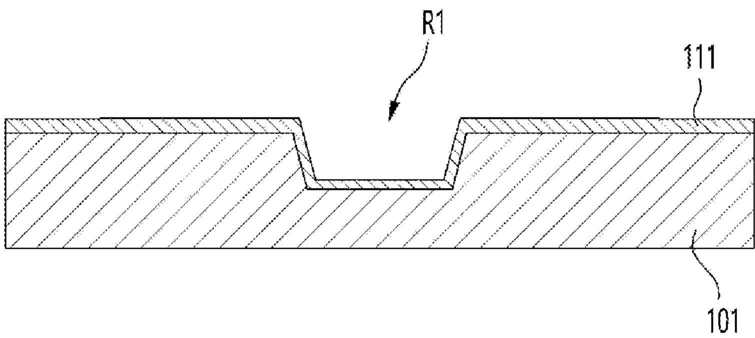
[FIG. 10B]
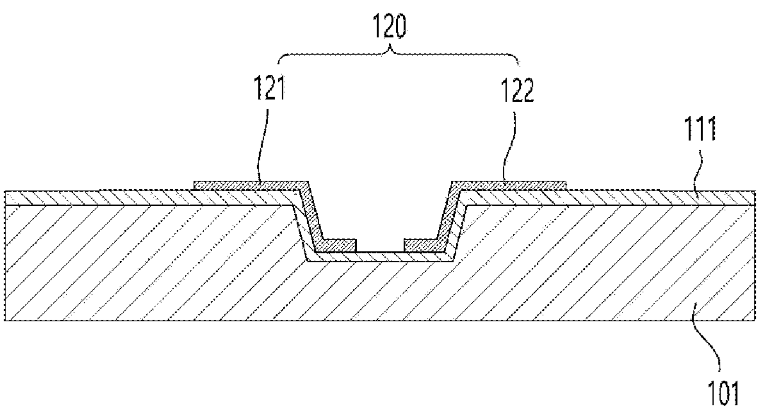
[FIG. 10C]
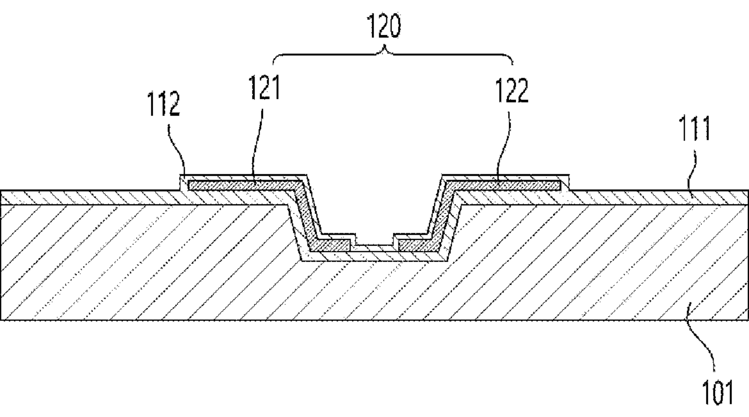

[FIG. 11A]
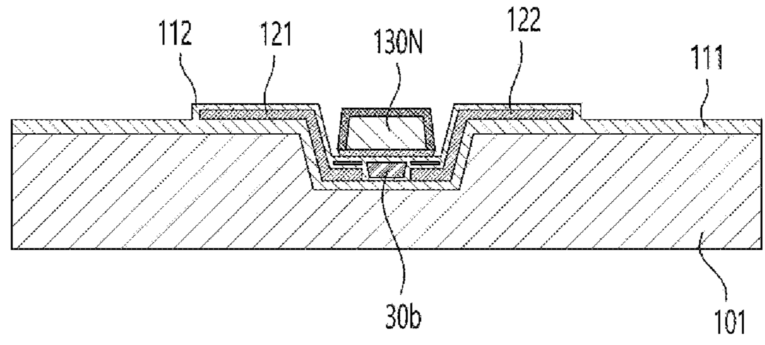
[FIG. 11B]
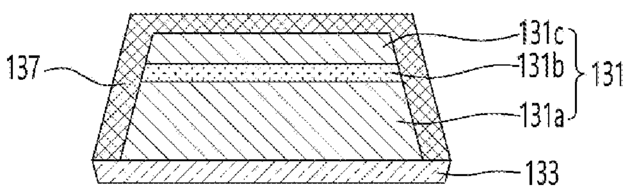
[FIG. 11C]
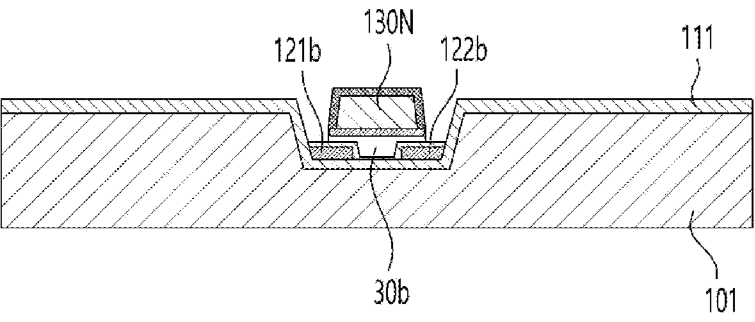

[FIG. 12]
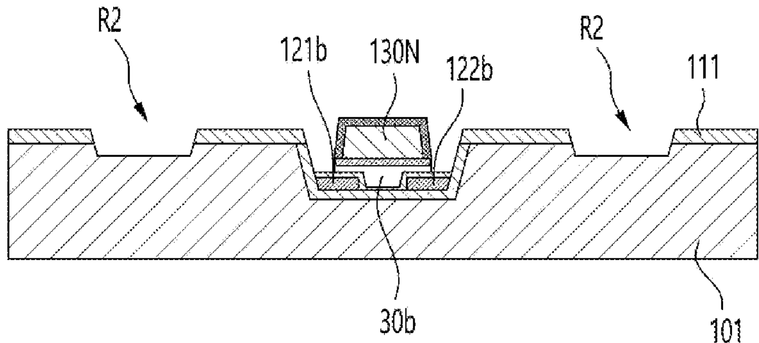
[FIG. 13A]
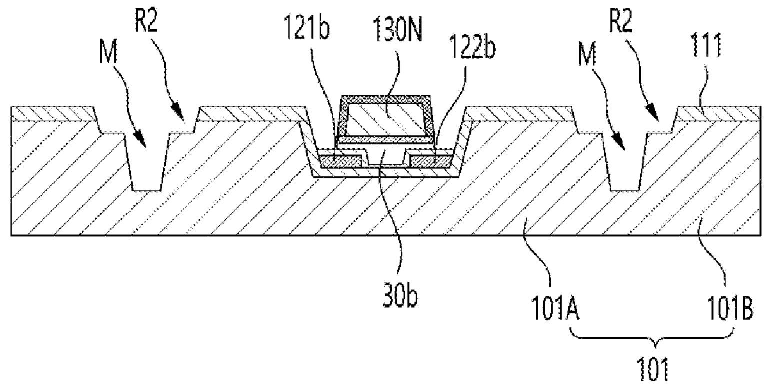
[FIG. 13B]
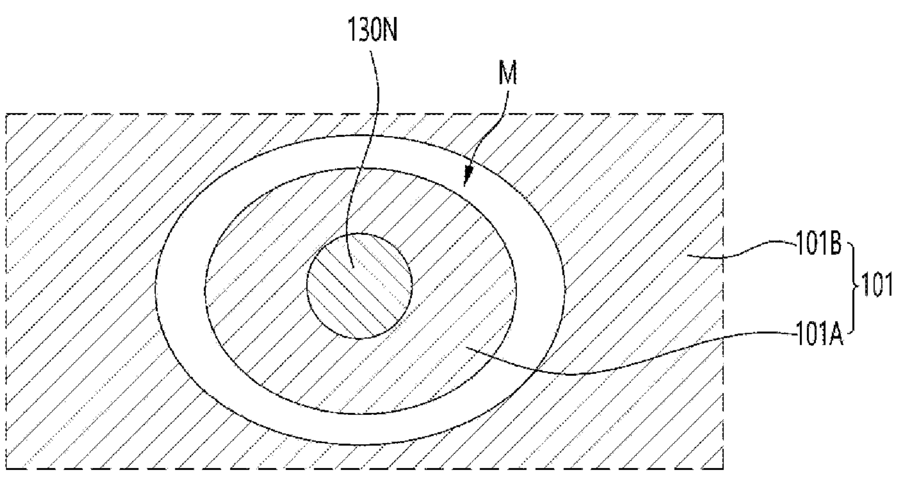

[FIG. 14A]
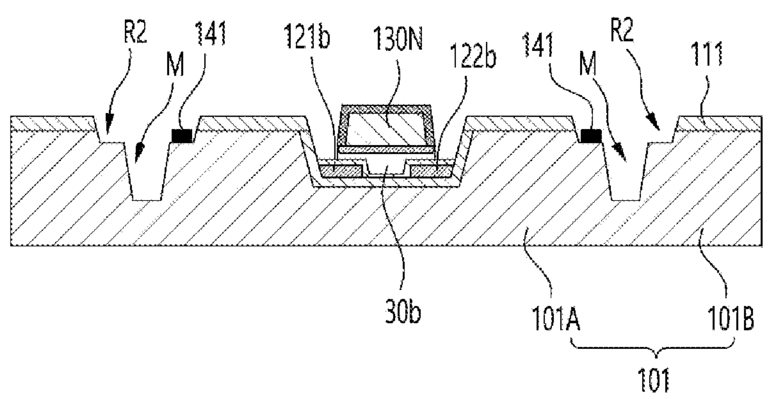
[FIG. 14B]
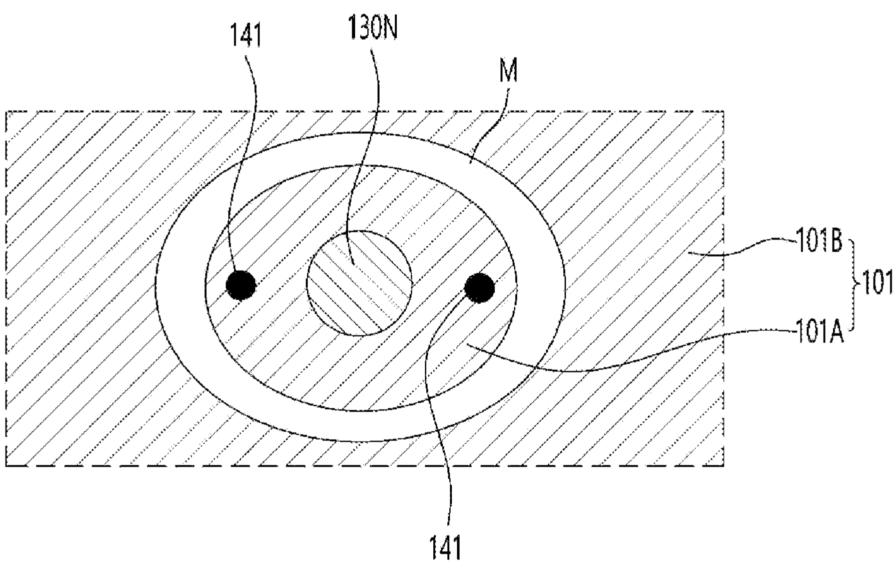

[FIG. 15A]
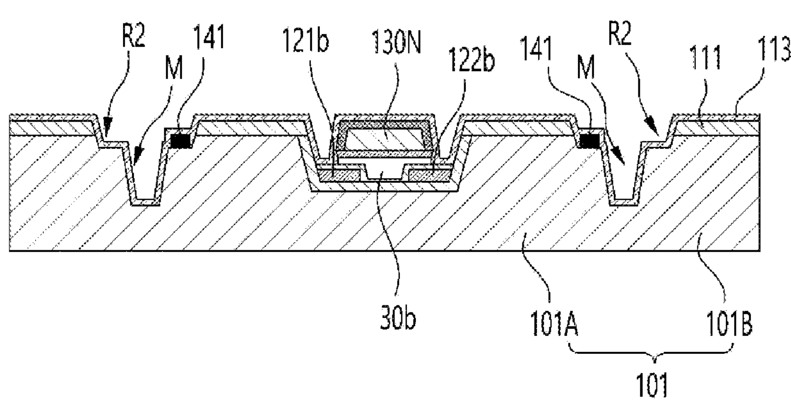
[FIG. 15B]
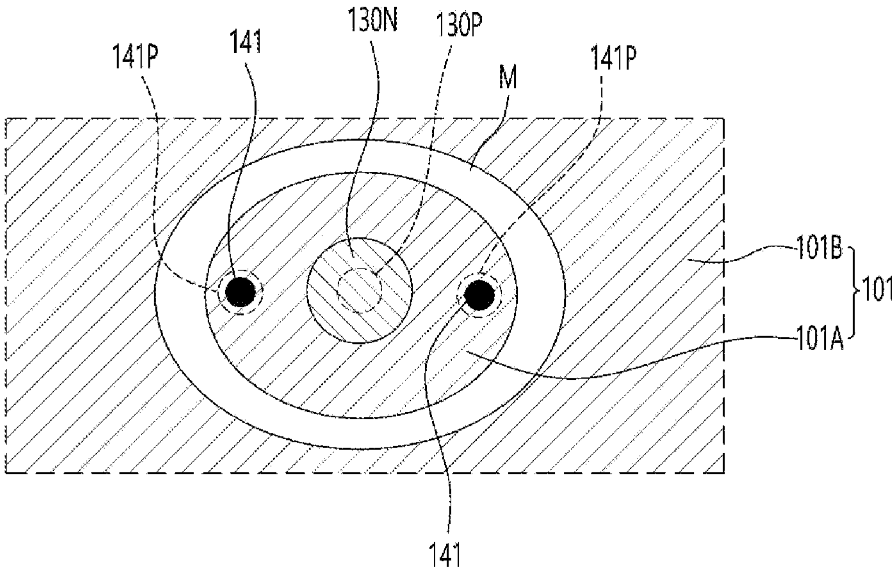

[FIG. 16]
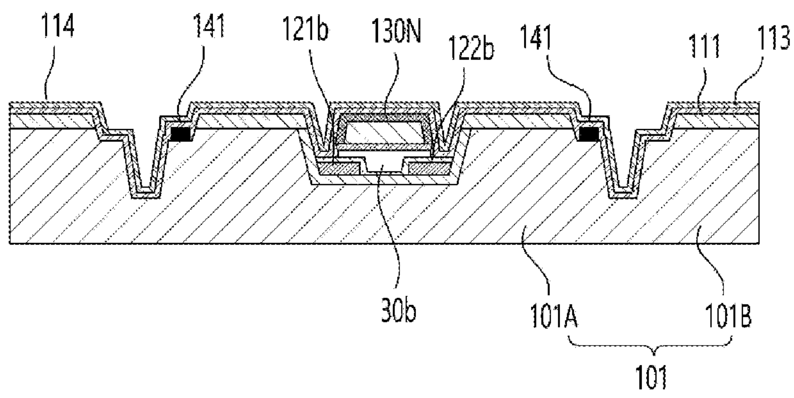
[FIG. 17]
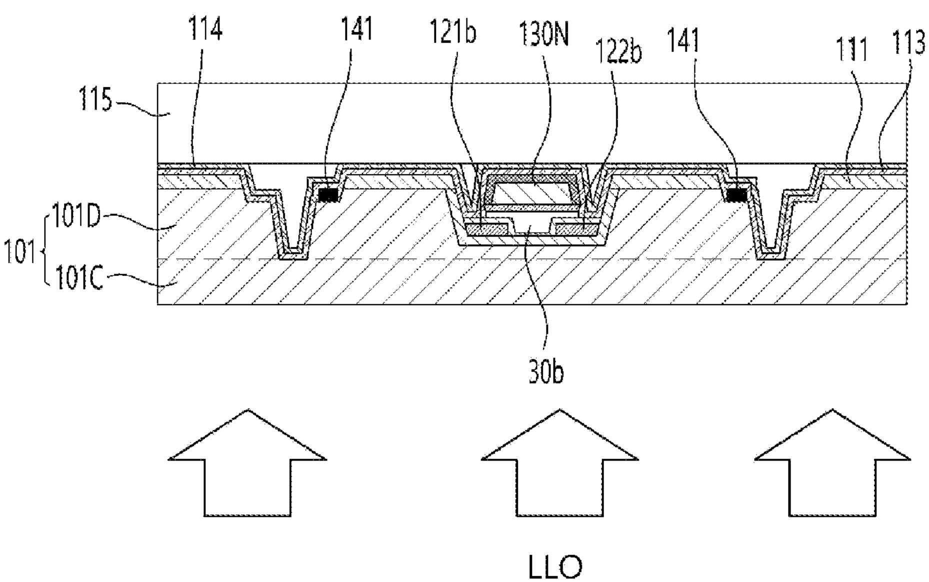

[FIG. 18A]
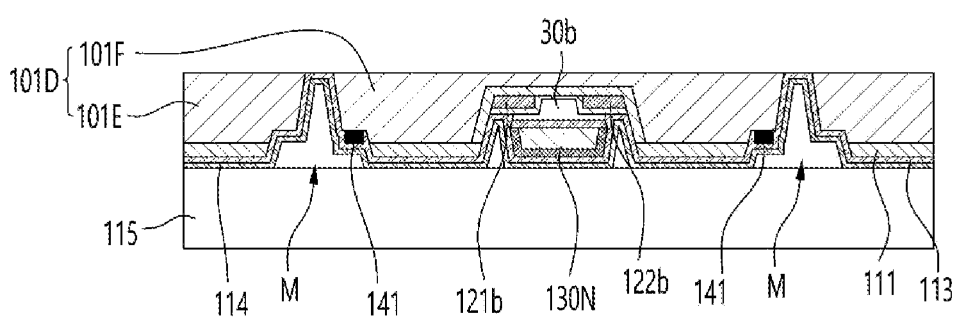
[FIG. 18B]
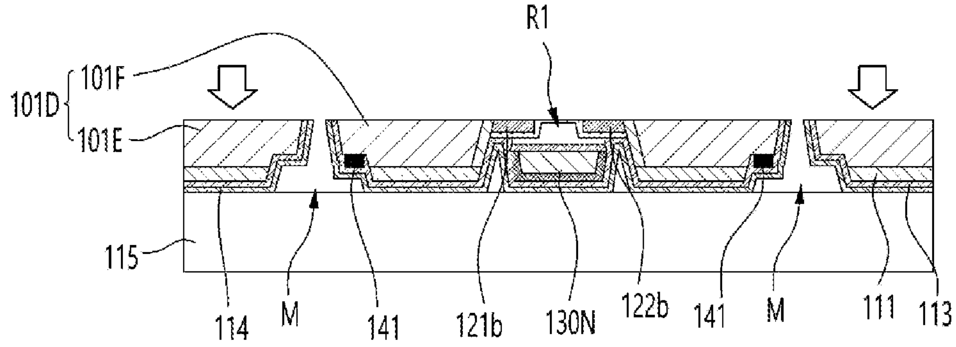
[FIG. 19]
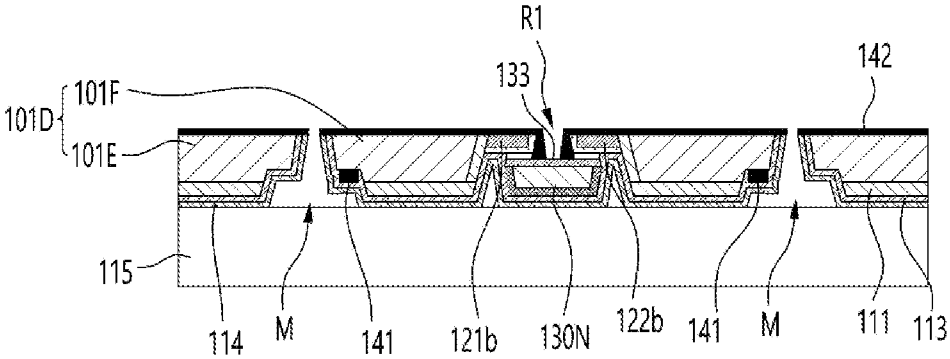

[FIG. 20A]
200N1
130N
110N
C1
C2
[FIG. 20B]
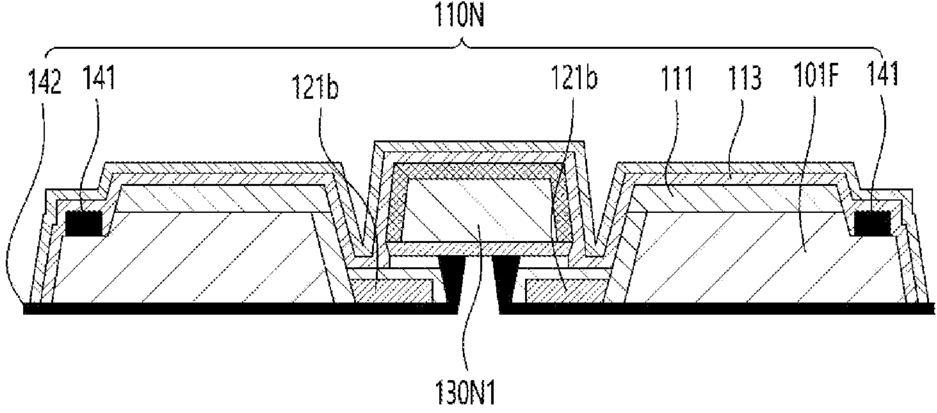

[FIG. 20C]
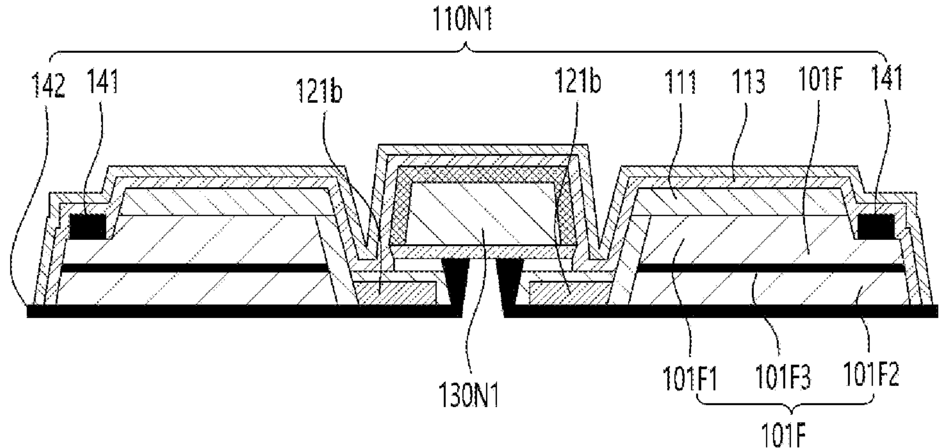
[FIG. 21]
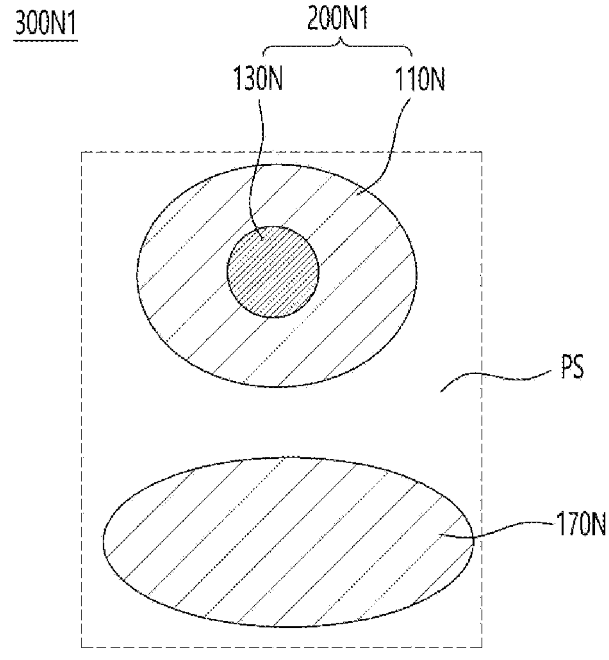

[FIG. 22]
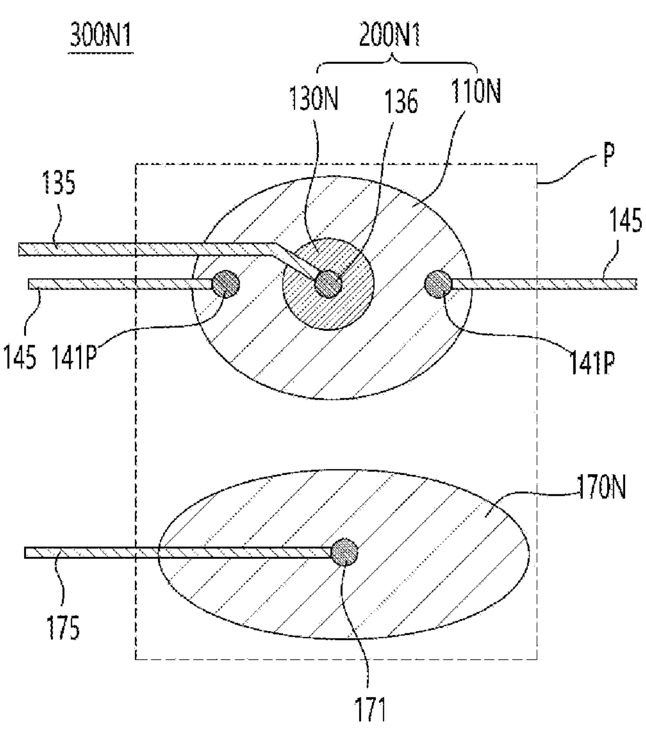

[FIG. 23]
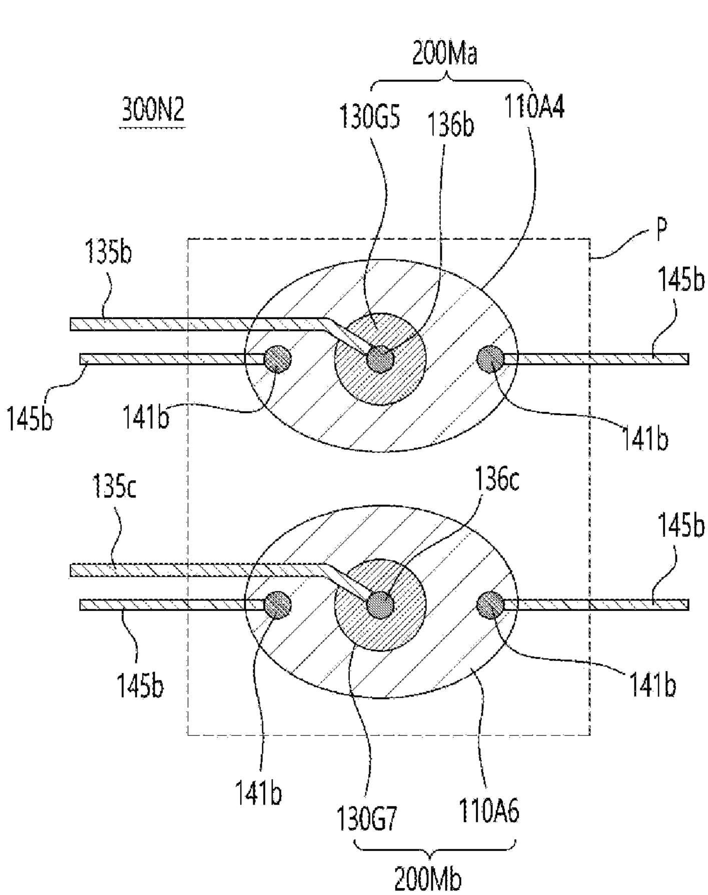

[FIG. 24]
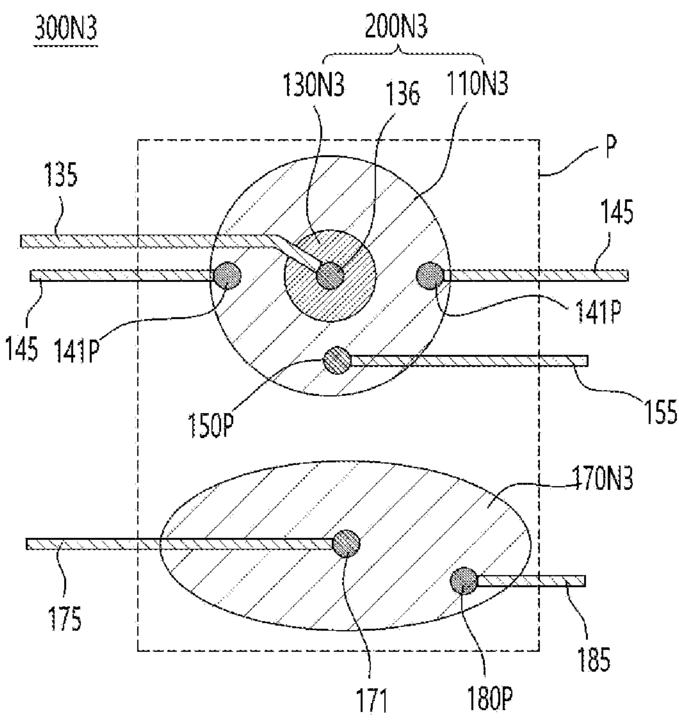

SEMICONDUCTOR LIGHT EMITTING DEVICE PACKAGE FOR DISPLAY PIXEL AND DISPLAY DEVICE INCLUDING THE SAME

CROSS-REFERENCE TO RELATED APPLICATION

Pursuant to 35 U.S.C. § 119(a), this application claims priority to Korean Application No. KR 10-2022-0100097, filed in the Republic of Korea on Aug. 10, 2022, the entire contents of which are hereby expressly incorporated by reference into the present application.

BACKGROUND OF THE DISCLOSURE

1. Field of the Disclosure

Embodiment relates to a semiconductor light emitting device package for a display pixel and a display device including the same.

2. Discussion of the Related Art

Large-area displays include liquid crystal displays (LCDs), OLED displays, and Micro-LED displays.

The micro-LED display is a display using micro-LED, which is a semiconductor light emitting device having a diameter or cross-sectional area of 100 μm or less, as a display device.

Micro-LED display has excellent performance in many characteristics such as contrast ratio, response speed, color reproduction rate, viewing angle, brightness, resolution, lifespan, luminous efficiency and luminance because it uses micro-LED, which is a semiconductor light emitting device, as a display device.

In particular, micro-LED displays can separate and combine screens in a modular manner.

So, the micro-LED display has the advantage of freely adjusting the size or resolution and the advantage of being able to implement a flexible display.

However, there is a technical problem in that it is difficult to quickly and accurately transfer the semiconductor light emitting device to the display panel because more than millions of semiconductor light emitting devices are required for a large micro-LED display.

Transfer technologies that have been recently developed include a pick and place process, a laser lift-off (LLO) method, or a self-assembly method.

Among these, the self-assembly method is a method in which a semiconductor light emitting device finds an assembly position in a fluid by itself, and is an advantageous method for implement a large-screen display device.

Recently, although a micro-LED structure suitable for self-assembly has been proposed in U.S. Pat. No. 9,825,202, etc., research on a technology for manufacturing a display through self-assembly of micro-LEDs is still insufficient.

In particular, in the case of quickly transferring millions or more semiconductor light emitting devices to a large display in the prior art, although the transfer speed can be improved, there is a technical problem in that the transfer error rate can be increased and the transfer yield is lowered.

In related technologies, a self-assembly type transfer process using dielectrophoresis (DEP) has been attempted.

However, there is a problem in that the self-assembly rate is low due to the non-uniformity of the DEP force.

On the other hand, according to an undisclosed internal technology, simultaneous assembly of a red (R) micro-LED chip, a green (G) micro-LED chip, and a blue (B) LED chip using dielectrophoresis is being studied.

However, in order to accurately assemble the R, G, and B LED chips into the corresponding assembly holes, research on the exclusiveness of the chip shape was conducted by making the horizontal sectional shapes of the R, G, and B LED chips different.

For example, according to undisclosed internal technology, the horizontal cross section of the R LED chip is a circular cross section. Based on this, the major axis was increased and the minor axis was decreased at regular intervals to form two elliptical shapes to produce B LED and G LED, assembly hole patterns (one circular, two elliptical) corresponding to these circular and elliptical LEDs were formed on the substrate.

Further, spaced assembly electrodes were formed inside the assembly hole so that LEDs could be assembled inside the assembly hole, and each assembly electrode was placed so that it could overlap the LED chip. Then, an electric field was formed between the two facing assembly electrodes to assemble the micro-LED by dielectrophoretic force.

However, according to an internal study, even if the shapes of the R, G, and B LED chips are exclusive, the applied DEP force is similar or the difference is not large, so there is a screen effect problem in which other LED chips block the assembly hole entrance.

For example, in the assembly hole for B LED chip, there was a screen effect problem in which the R LED chip or the G LED chip blocked the entrance of the assembly hole. Accordingly, there is a problem that the simultaneous assembly rate for the three-color R, G, and B chips is low because the problem of DEP selectivity deterioration occurs between the LED chips.

In particular, recent studies have been conducted on the adoption of micro-LED displays for UHD (Ultra High Definition) TVs, VR, AR, and XR. A size of 20 μm or less, for example, 10 μm or less, is required for micro-LED s used in such UHD TVs, VR, AR, XR, etc.

However, in order to secure exclusivity, which is the gap between the shape differences between R, G, and B LED chips, the size of the round-shaped chip needs to be at least 42 μm in order to implement the remaining two elliptical-shaped chips exclusively.

Accordingly, according to the internal technology, in order to secure the exclusivity of shape among the R, G, B LED chips, the size of the R, G, B LED chips cannot be reduced to less than 42 μm.

Therefore, there is an urgent need to develop micro-LED sizes and DEP assembly technologies that can be used in UHD TVs, VR, AR, and XR.

In particular, in internal technology, the epitaxial layer of G and B LED chips is formed of GaN material, whereas the epitaxial layer of R-chip is formed of AlGaInP material.

Accordingly, since G, B LED chips and R-chip are heterogeneous materials, there is a difference in DEP force due to the difference in dielectric constant and electrical conductivity, so it is difficult to control DEP force when assembling R, G, B LED chips simultaneously.

On the other hand, in case of increasing exclusivity by adding more differences in horizontal cross-sectional shapes of R, G, and B LED chips to improve DEP selectivity, by increasing the DEP force deviation in each assembly hole between these R, G, and B LED chips, due to the long axis of the elliptical LED chip and the shape of the elliptical assembly hole with the long axis, a technical contradiction occurs in which the probability of assembling into the assembly hole is reduced.

SUMMARY OF THE DISCLOSURE

One of the technical objects of the embodiment is to increase the assembly probability of R, G, B LED chips capable of self-emission of R, G, B colors by securing exclusiveness among R, G, B LED chips while being a micro-LED size that can be used in UHD TV, VR, AR, XR, etc.

Further, one of the technical objects of the embodiment is to increase assembly probability while increasing DEP selectivity for LED chips for each color in a self-assembly method using dielectrophoresis (DEP).

On the other hand, since G, B LED chips and R-chip are heterogeneous materials, differences in dielectric constant and electrical conductivity can occur.

Therefore, one of the technical objects of the embodiment is to overcome the difficulty of simultaneous assembly of R, G, and B LED chips due to the difference in DEP force.

The technical objects of the embodiment are not limited to those described in this section, and include those that can be understood throughout the specification.

The semiconductor light emitting device package for display pixels according to the embodiment can include a first color semiconductor light emitting device having a first material and a second color semiconductor light emitting device having a second material disposed on the first color semiconductor light emitting device.

The semiconductor light emitting device of the first color can include a first semiconductor light emitting structure having an inner recess, a first-first electrode layer and a first-second electrode layer electrically connected to one side and the other side of the first semiconductor light emitting structure, respectively.

The second color semiconductor light emitting device can be disposed in the inner recess of the first color semiconductor light emitting device.

The first semiconductor light emitting structure of the first color semiconductor light emitting device can include a first conductivity type first-first semiconductor layer a first-second conductivity type semiconductor layer or the second conductivity type, and a first active layer disposed therebetween.

The first-first electrode can be electrically connected to the first-first semiconductor layer of the first conductivity type, and the first-second electrode layer can be electrically connected to the first-second semiconductor layer of the second conductivity type and the semiconductor light emitting device of the second color.

The embodiment can further include a first-first metal layer and a second-first metal layer electrically insulated between the second color semiconductor light emitting device and the first color semiconductor light emitting device.

The first-first metal layer and the second-first metal layer can include a reflective metal layer.

The embodiment can further include a semiconductor light emitting device of a third color having a first material disposed on one side of the semiconductor light emitting device of the first color and the semiconductor light emitting device of the second color.

Further, the semiconductor light emitting device package for a display pixel according to the embodiment can include an elliptical second-first composite semiconductor light emitting device package made of a heterogeneous material.

Further, the embodiment can include an elliptical second-second composite semiconductor light emitting device package of heterogeneous materials.

The long axis of the second-second composite semiconductor light emitting device package can be greater than the long axis of the second-first composite semiconductor light emitting device package.

The second-first complex semiconductor light emitting device package can include a fourth semiconductor light emitting device of a second color of a second epitaxial layer material and a fifth semiconductor light emitting device of a first color of a first epitaxial layer material disposed on the fourth semiconductor light emitting device of the second color.

The fourth semiconductor light emitting device of the second color can include a fourth semiconductor light emitting structure having an inner recess, and a fifth semiconductor light emitting device of the first color can be disposed in the inner recess of the fourth semiconductor light emitting structure.

The second-second complex semiconductor light emitting device package can include a sixth semiconductor light emitting device of a second color of a second epitaxial layer material and a seventh semiconductor light emitting device of a third color of a first epitaxial layer material disposed on the sixth semiconductor light emitting device of the second color.

The sixth semiconductor light emitting device of the second color includes a sixth semiconductor light emitting structure having an inner recess, and a seventh semiconductor light emitting device of the third color can be disposed in the inner recess of the sixth semiconductor light emitting structure.

The semiconductor light emitting device display device according to the embodiment can include any one of the semiconductor light emitting device packages for display pixels.

According to the embodiment, G, B LED chips and R chips are heterogeneous materials, so there is a difference in dielectric constant and electrical conductivity, so there is a technical effect that can solve the difficulty of controlling the DEP force when assembling R, G, B LED chips at the same time.

Specifically, according to the embodiment, after assembling a red-LED on a GaN substrate with depth force, the GaN substrate can be patterned to manufacture a green LED. Through this, the embodiment can manufacture a green-red LED package in which a red-LED is disposed in the center on a green LED.

Thereafter, by simultaneously assembling the Green-Red LED package and the GaN-based Blue LED on the panel substrate using magnetic and electrical power, there is a technical effect that enables simultaneous assembly of R, G, and B LEDs.

In particular, according to the embodiment, the Green LED serving as the package body can be a GaN material, and the remaining Blue LEDs can also be a GaN material.

Therefore, there is no difference in dielectric constant and electrical conductivity even when a Green-Red LED package and a Blue LED based on the homologous substances are simultaneously assembled, so that there is a special technical effect that can precisely control the DEP force when assembling R, G, and B LED chips at the same time.

Further, according to the embodiment, the embodiment can increase the assembly probability of R, G, B LED chips capable of self-emitting of R, G, B colors by securing exclusiveness between R, G, and B LED chips while having a micro-LED size that can be employed in UHD TV, VR, AR, XR, etc.

For example, according to the embodiment, the number of cases of exclusivity is reduced in the form of two ellipticals with different outline shapes, so the embodiment has a technical effect of dramatically reducing the size of the pixel P1 by providing an ultra-compact G-R LED package that is less than 30 um and capable of simultaneous or sequential assembly of R, G, and B and a display panel structure of a B chip structure.

Specifically, in the LED package of the first color and the second color and the LED chip of the third color based on the homologous substances, the outer shapes of the first color and second color LED packages and the third color LED chip can be two different shapes. The number of cases of exclusivity is reduced to two, it is possible to provide the LED package of the first color and the second color is smaller than 30 um and can be assembled simultaneously or sequentially with R, G, and B and a display panel structure with a third color LED chip structure, so that the pixel size can be drastically reduced and the assembly speed can be remarkably improved.

For example, according to internal technology, in order to secure exclusiveness of shape among R, G, B LED chips, there is a contradiction of not being able to reduce the size of R, G, B LED chips to less than 42 μm. Therefore, there is an urgent need to develop micro-LED size and DEP assembly technology that can be used in UHD TV, VR, AR, and XR.

In the embodiment, if a subminiature first and second color LED package and a third color LED chip structure are applied, when the sizes of the first color and second color LED packages are about 24 to 30 μm, the size of the third color LED chips can be controlled to be about 18 to 36 μm.

The first color and second color LED packages can have a first circular shape or a first elliptical shape, but are not limited thereto.

The structure of the third color LED chip can have a second elliptical shape or a second circular shape, but is not limited thereto.

Through this, according to the embodiment, it is possible to secure the exclusivity among R, G, and B LED chips even though it is a micro-LED size that can be employed in UHD TV, VR, AR, XR, etc.

Accordingly, the embodiment has a special technical effect of increasing the assembly probability of R, G, and B LED chips capable of self-emission of R, G, and B colors.

Further, according to the display device according to the embodiment, in a self-assembly method using dielectrophoresis (DEP), there is a special technical effect that can simultaneously increase assembly probability while increasing DEP selectivity for LED chips for each color.

BRIEF DESCRIPTION OF THE DRAWINGS

The present invention will become more fully understood from the detailed description given hereinbelow and the accompanying drawings which are given by way of illustration only, and thus are not limitative of the present invention.

FIG. 1 is an exemplary view of a living room of a house in which a display device according to an embodiment is disposed.

FIG. 2 is a block diagram schematically illustrating a display device according to an exemplary embodiment.

FIG. 3 is a circuit diagram showing an example of a pixel of FIG. 2.

FIG. 4 is an enlarged view of a first panel area in the display device of FIG. 1.

FIG. 5 is a cross-sectional view along line B1-B2 of area A2 of FIG. 4.

FIG. 6 is an exemplary view in which a light emitting device according to an embodiment is assembled to a substrate by a self-assembly method.

FIG. 7 is a partially enlarged view of area A3 of FIG. 6.

FIGS. 8A and 8B are structural diagrams of assembly substrates according to an embodiment.

FIG. 8C is an exemplary view of an assembly hole shown in FIG. 8A.

FIG. 9A is a plan view of a first display device 300N1 in which a semiconductor light emitting device package 200N1 for a display pixel according to the first embodiment is mounted.

FIG. 9B is a cross-sectional view taken along line C1-C2 of the semiconductor light emitting device package 200N1 for a display pixel according to the first embodiment shown in FIG. 9A.

FIGS. 10A to 22 are cross-sectional views of a manufacturing process of a semiconductor light emitting device package 200N1 for a display pixel according to a first embodiment according to an embodiment and a first semiconductor light emitting device display device 300N1 including the same.

FIG. 23 is a plan view of a second display device 300N2 including a composite semiconductor light emitting device package of heterogeneous materials.

FIG. 24 is a plan view of a third display device 300N3 including a composite semiconductor light emitting device package of heterogeneous materials.

DETAILED DESCRIPTION OF THE EMBODIMENTS

Hereinafter, embodiments disclosed in the present description will be described in detail with reference to the accompanying drawings. The suffixes 'module' and 'part' for components used in the following description are given or mixed in consideration of ease of specification, and do not have a meaning or role distinct from each other by themselves. Further, the accompanying drawings are provided for easy understanding of the embodiments disclosed in the present specification, and the technical ideas disclosed in the present specification are not limited by the accompanying drawings. Further, when an element, such as a layer, area, or substrate, is referred to as being 'on' another component, this includes that it is directly on the other element or there can be other intermediate elements in between.

The display device described in this specification includes a digital TV, a mobile phone, a smart phone, a laptop computer, a digital broadcasting terminal, a personal digital assistant (PDA), a portable multimedia player (PMP), a navigation, a Slate PC, a Tablet PC, an Ultra-Book, a desktop computer, and the like.

However, the configuration according to the embodiment described in this specification can be applied to a device capable of displaying even a new product type to be developed in the future.

Hereinafter, a semiconductor light emitting device according to an embodiment and a display device including the same will be described.

FIG. 1 shows a living room of a house in which a display device 100 according to an embodiment is disposed.

The display device 100 of the embodiment can display the status of various electronic products such as the washing machine 104, the robot cleaner 102, and the air purifier 103, and communicate with each electronic product based on IOT, and can control each electronic product based on the user's setting data.

The display device 100 according to the embodiment can include a flexible display manufactured on a thin and flexible substrate. The flexible display can be bent or rolled like paper while maintaining the characteristics of a conventional flat panel display.

In the flexible display, visual information can be implemented by independently controlling light emission of unit pixels arranged in a matrix form. A unit pixel means a minimum unit for realizing one color.

The unit pixel of the flexible display can be implemented by a light emitting device. In an embodiment, the light emitting device can be a Micro-LED or a Nano-LED, but is not limited thereto.

Next, FIG. 2 is a block diagram schematically showing a display device according to an embodiment, and FIG. 3 is a circuit diagram showing an example of the pixel of FIG. 2.

Referring to FIGS. 2 and 3, the display device according to the embodiment can include a display panel 10, a driving circuit 20, a scan driving unit 30, and a power supply circuit 50.

The display device 100 according to the embodiment can drive the light emitting device using an active matrix (AM) method or a passive matrix (PM, passive matrix) method.

The driving circuit 20 can include a data driving unit 21 and a timing control unit 22.

The display panel 10 can be divided into a display area DA and a non-display area NDA disposed around the display area DA. The display area DA is an area in which pixels PX are formed to display an image. The display panel 10 includes data lines (D1 to Dm, m is an integer greater than or equal to 2), scan lines crossing the data lines D1 to Dm (S1 to Sn, n is an integer greater than or equal to 2), the high-potential voltage line supplied with the high-voltage, the low-potential voltage line supplied with the low-potential voltage, and the pixels PX connected to the data lines D1 to Dm and the scan lines Si to Sn can be included.

Each of the pixels PX can include a first sub-pixel PX1, a second sub-pixel PX2, and a third sub-pixel PX3. The first sub-pixel PX1 emits a first color light of a first wavelength, the second sub-pixel PX2 emits a second color light of a second wavelength, and the third sub-pixel PX3 emits a third color light of a wavelength can be emitted. The first color light can be red light, the second color light can be green light, and the third color light can be blue light, but is not limited thereto. Further, although it is illustrated that each of the pixels PX includes three sub-pixels in FIG. 2, the present invention is not limited thereto. For example, each of the pixels PX can include four or more sub-pixels.

Each of the first sub-pixel PX1, the second sub-pixel PX2, and the third sub-pixel PX3 can connected to at least one of the data lines D1 to Dm, and at least one of the scan lines S1 to Sn, and a high potential voltage line. As shown in FIG. 3, the first sub-pixel PX1 can include the light emitting devices LD, plurality of transistors for supplying current to the light emitting devices LD, and at least one capacitor Cst.

Each of the first sub-pixel PX1, the second sub-pixel PX2, and the third sub-pixel PX3 can include only one light emitting device LD and at least one capacitor Cst.

Each of the light emitting devices LD can be a semiconductor light emitting diode including a first electrode, a plurality of conductivity type semiconductor layers, and a second electrode. Here, the first electrode can be an anode electrode and the second electrode can be a cathode electrode, but the present invention is not limited thereto.

Referring to FIG. 3, the plurality of transistors can include a driving transistor DT for supplying current to the light emitting devices LD, and a scan transistor ST for supplying a data voltage to the gate electrode of the driving transistor DT. The driving transistor DT can include a gate electrode connected to the source electrode of the scan transistor ST, a source electrode connected to a high potential voltage line to which a high potential voltage is applied, and a drain electrode connected to first electrodes of the light emitting devices LD. The scan transistor ST can include a gate electrode connected to the scan line Sk, where k is an integer satisfying $1 \leq k \leq n$, a source electrode connected to the gate electrode of the driving transistor DT, and a drain electrode connected to data lines Dj, where j is integer satisfying $1 \leq j \leq m$.

The capacitor Cst is formed between the gate electrode and the source electrode of the driving transistor DT. The storage capacitor Cst can charge a difference between the gate voltage and the source voltage of the driving transistor DT.

The driving transistor DT and the scan transistor ST can be formed of a thin film transistor. Further, although the driving transistor DT and the scan transistor ST have been mainly described in FIG. 3 as being formed of a P-type MOSFET (Metal Oxide Semiconductor Field Effect Transistor), the present invention is not limited thereto. The driving transistor DT and the scan transistor ST can be formed of an N-type MOSFET. In this case, the positions of the source electrode and the drain electrode of each of the driving transistor DT and the scan transistor ST can be changed.

Further, in FIG. 3 has been illustrated each of the first sub-pixel PX1, the second sub-pixel PX2, and the third sub-pixel PX3 includes one driving transistor DT, one scan transistor ST, and 2T1C (2 Transistor—1 capacitor) having a capacitor Cst, but the present invention is not limited thereto. Each of the first sub-pixel PX1, the second sub-pixel PX2, and the third sub-pixel PX3 can include a plurality of scan transistors ST and a plurality of capacitors Cst.

Referring back to FIG. 2, the driving circuit 20 outputs signals and voltages for driving the display panel 10. To this end, the driving circuit 20 can include a data driver 21 and a timing controller 22.

The data driver 21 receives digital video data DATA and a source control signal DCS from the timing controller 22. The data driver 21 converts the digital video data DATA into analog data voltages according to the source control signal DCS and supplies them to the data lines D1 to Dm of the display panel 10.

The timing controller 22 receives digital video data DATA and timing signals from the host system. The timing signals can include a vertical sync signal, a horizontal sync signal, a data enable signal, and a dot clock. The host system can be an application processor of a smartphone or tablet PC, a monitor, or a system-on-chip of a TV.

The scan driver 30 receives the scan control signal SCS from the timing controller 22. The scan driver 30 generates scan signals according to the scan control signal SCS and supplies them to the scan lines S1 to Sn of the display panel 10. The scan driver 30 can include a plurality of transistors and can be formed in the non-display area NDA of the display panel 10. Further, the scan driver 30 can be formed of an integrated circuit, and in this case, can be mounted on a gate flexible film attached to the other side of the display panel 10.

The power supply circuit 50 generates a high potential voltage VDD and a low potential voltage VSS for driving the light emitting devices LD of the display panel 10 from the main power source, and the power supply circuit can supply VDD and VSS to the high-potential voltage line VDDL and the low-potential voltage line VSSL of the display panel 10.

Further, the power supply circuit 50 can generate and supply driving voltages for driving the driving circuit 20 and the scan driving unit 30 from the main power.

Next, FIG. 4 is an enlarged view of the first panel area A1 in the display device of FIG. 1.

Referring to FIG. 4, the display device 100 according to the embodiment can be manufactured by mechanically and electrically connecting a plurality of panel areas such as the first panel area A1 by tiling.

The first panel area A1 can include a plurality of light emitting devices 150 arranged for each unit pixel (PX in FIG. 2).

For example, the unit pixel PX can include a first sub-pixel PX1, a second sub-pixel PX2, and a third sub-pixel PX3. For example, a plurality of red light-emitting devices 150R are disposed in the first sub-pixel PX1, a plurality of green light-emitting devices 150G are disposed in the second sub-pixel PX2, and a plurality of blue light-emitting devices 150B are disposed in the third sub-pixel PX3.

The unit pixel PX can further include a fourth sub-pixel in which a light emitting device is not disposed, but is not limited thereto. Meanwhile, the light emitting device 150 can be the semiconductor light emitting device.

Next, FIG. 5 is a cross-sectional view taken along line B1-B2 of area A2 of FIG. 4.

Referring to FIG. 5, the display device 100 of the embodiment includes a substrate 200*a*, wirings 201*a* and 202*a* spaced apart from each other, a first insulating layer 211*a*, a second insulating layer 211*b*, a third insulating layer 206 and a plurality of light emitting devices 150.

The wiring can include a first wiring 201*a* and a second wiring 202*a* spaced apart from each other. The first wiring 201*a* and the second wiring 202*a* can function as panel wiring for applying power to the light emitting device 150 in the panel, and in the case of self-assembly of the light emitting device 150, further, the first wiring 201*a* and the second wiring 202*a* can function as an assembly electrode for generating a dielectrophoresis force.

The wirings 201*a* and 202*a* can be formed of a transparent electrode (ITO) or include a metal material having excellent electrical conductivity. For example, the wirings 201*a* and 202*a* can be formed at least one of titanium (Ti), chromium (Cr), nickel (Ni), aluminum (Al), platinum (Pt), gold (Au), tungsten (W), molybdenum (Mo) or an alloy thereof.

A first insulating layer 211*a* can be disposed between the first wiring 201*a* and the second wiring 202*a*, and a second insulating layer 211*b* can be disposed on the first wiring 201*a* and the second wiring 202*a*.

The first insulating layer 211*a* and the second insulating layer 211*b* can be an oxide film, a nitride film, or the like, but are not limited thereto.

The light emitting device 150 can include a red light emitting device 150R, a green light emitting device 150G, and a blue light emitting device 150B0 to form a sub-pixel, respectively, but is not limited thereto. The light emitting device 150 can include a red phosphor and a green phosphor to implement red and green, respectively.

The substrate 200 can be formed of glass or polyimide. Further, the substrate 200 can include a flexible material such as polyethylene naphthalate (PEN) or polyethylene terephthalate (PET). Further, the substrate 200 can include a transparent material, but is not limited thereto. The substrate 200 can function as a support substrate in the panel, and can function as a substrate for assembly when self-assembling the light emitting device.

The third insulating layer 206 can include an insulating and flexible material such as polyimide, PEN, or PET, and can be integrally formed with the substrate 200 to form one substrate.

The third insulating layer 206 can be a conductive adhesive layer having adhesiveness and conductivity, and the conductive adhesive layer can be flexible to enable a flexible function of the display device. For example, the third insulating layer 206 can be an anisotropy conductive film (ACF) or a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

The distance between the wirings 201*a* and 202*a* is formed to be smaller than the width of the light emitting device 150 and the width of the assembly hole 203, so that the assembly position of the light emitting device 150 using an electric field can be more precisely fixed.

A third insulating layer 206 is formed on the wirings 201*a* and 202*a* to protect the 201*a* and 202*a* from the fluid 1200, and the third insulating layer 206 can prevent leakage of current flowing through the two wirings 201*a* and 202*a*. The third insulating layer 206 can be formed of a single layer or multiple layers of an inorganic insulator such as silica or alumina or an organic insulator.

Further, the third insulating layer 206 can include an insulating and flexible material such as polyimide, PEN, PET, etc., and can be formed integrally with the substrate 200 to form a single substrate.

The third insulating layer 206 has a barrier wall, and an assembly hole 203 can be formed by the barrier wall. For example, the third insulating layer 206 can include an assembly hole 203 through which the light emitting device 150 is inserted (refer to FIG. 6).

Accordingly, during self-assembly, the light emitting device 150 can be easily inserted into the assembly hole 203 of the third insulating layer 206. The assembly hole 203 can be referred to as an insertion hole, a fixing hole, or an alignment hole.

The assembly hole 203 can have a shape and a size corresponding to the shape of the light emitting device 150 to be assembled at a corresponding position.

Accordingly, it is possible to prevent other light emitting devices from being assembled in the assembly hole 203 or from assembling a plurality of light emitting devices.

Figure 7:
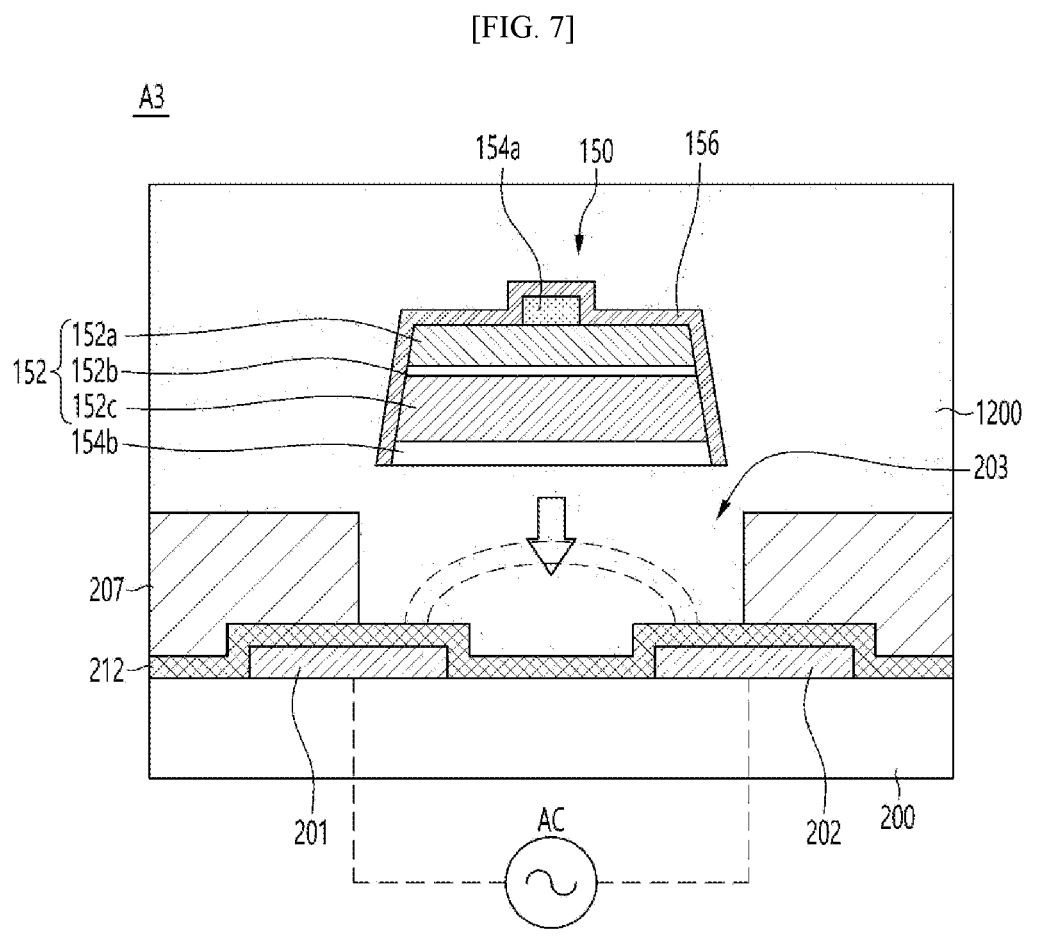

Next, FIG. 6 is a view showing an example in which a light emitting device according to an embodiment is assembled to a substrate by a self-assembly method, and FIG. 7 is a partially enlarged view of an area A3 of FIG. 6, and FIG. 7 is a view in which area A3 is rotated 180 degrees for convenience of description.

An example of assembling the semiconductor light emitting device according to the embodiment to a display panel by a self-assembly method using an electromagnetic field will be described based on FIGS. 6 and 7.

The assembly substrate 200 described below can also function as a panel substrate 200 in a display device after assembling a light emitting device, but the embodiment is not limited thereto.

Referring to FIG. 6, the semiconductor light emitting device 150 can be put into the chamber 1300 filled with the fluid 1200, and the semiconductor light emitting device 150 by the magnetic field generated from the assembly device 1100 can move to the assembly substrate 200. In this case, the light emitting device 150 adjacent to the assembly hole 203 of the assembly substrate 200 can be assembled in the assembly hole 230 by a dielectrophoretic force by an electric field of the assembly electrodes. The fluid 1200 can be water such as ultrapure water, but is not limited thereto. A chamber can be referred to as a water bath, container, vessel, or the like.

After the semiconductor light emitting device 150 is put into the chamber 1300, the assembly substrate 200 can be disposed on the chamber 1300. According to an embodiment, the assembly substrate 200 can be introduced into the chamber 1300.

Referring to FIG. 7, the semiconductor light emitting device 150 can be implemented as a vertical semiconductor light emitting device as shown, but is not limited thereto, and a horizontal light emitting device can be employed.

The semiconductor light emitting device 150 can include a magnetic layer having a magnetic material. The magnetic layer can include a magnetic metal such as nickel (Ni). Since the semiconductor light emitting device 150 injected into the fluid includes a magnetic layer, it can move to the substrate 200 by the magnetic field generated from the assembly device 1100. The magnetic layer can be disposed above or below or on both sides of the light emitting device.

The semiconductor light emitting device 150 can include a passivation layer 156 surrounding the top and side surfaces. The passivation layer 156 can be formed by using an inorganic insulator such as silica or alumina through PECVD, LPCVD, sputtering deposition, or the like. Further, the passivation layer 156 can be formed through a method of spin coating an organic material such as a photoresist or a polymer material.

The semiconductor light emitting device 150 can include a structure 152 having a first conductivity type semiconductor layer 152*a*, a second conductivity type semiconductor layer 152*c*, and an active layer 152*b* disposed between the first conductivity type semiconductor layer 152*a* and the second conductivity type semiconductor layer 152*c*. The first conductivity type semiconductor layer 152*a* can be an n-type semiconductor layer, and the second conductivity type semiconductor layer 152*c* can be a p-type semiconductor layer, but is not limited thereto.

A first electrode 154*a* can be connected to the first conductivity type semiconductor layer 152*a*, and a second electrode 154*b* can be connected to the second conductivity type semiconductor layer 152*c*. To this end, partial areas of the first conductivity type semiconductor layer 152*a* and the second conductivity type semiconductor layer 152*c* can be exposed to the outside. Accordingly, in a manufacturing process of a display device after the semiconductor light emitting device 150 is assembled to the assembly substrate 200, a portion of the passivation layer 156 can be etched.

The assembly substrate 200 can include a pair of first assembly electrodes 201 and second assembly electrodes 202 corresponding to each of the semiconductor light emitting devices 150 to be assembled. The first assembly electrode 201 and the second assembly electrode 202 can be formed by stacking a single metal, a metal alloy, or a metal oxide in multiple layers. For example, the first assembly electrode 201 and the second assembly electrode 202 can be formed including at least one of Cu, Ag, Ni, Cr, Ti, Al, Rh, Pd, Ir, Ru, Mg, Zn, Pt, Au, or Hf, but is not limited thereto. Further, the first assembly electrode 201 and the second assembly electrode 202 can be formed including at least one of ITO (indium tin oxide), IZO (indium zinc oxide), IZTO (indium zinc tin oxide), IAZO (indium aluminum zinc oxide), Indium gallium zinc oxide (IGZO), indium gallium tin oxide (IGTO), aluminum zinc oxide (AZO), antimony tin oxide (ATO), GZO (gallium zinc oxide), IZON (IZO Nitride), AGZO (Al—Ga ZnO), In—Ga ZnO (IGZO), ZnO, IrOx, RuOx, NiO, RuOx/ITO, Ni/IrOx/Au, or Ni/IrOx/Au/ITO The first assembly electrode 201, the second assembly electrode 202 emits an electric field as an AC voltage is applied, the semiconductor light emitting device 150 inserted into the assembly hole 203 can be fixed by dielectrophoretic force. A distance between the first assembly electrode 201 and the second assembly electrode 202 can be smaller than a width of the semiconductor light emitting device 150 and a width of the assembly hole 203, the assembly position of the semiconductor light emitting device 150 using the electric field can be more precisely fixed.

An insulating layer 212 is formed on the first assembly electrode 201 and the second assembly electrode 202 to protect the first assembly electrode 201 and the second assembly electrode 202 from the fluid 1200 and leakage of current flowing through the first assembly electrode 201 and the second assembly electrode 202 can be prevented. For example, the insulating layer 212 can be formed of a single layer or multiple layers of an inorganic insulator such as silica or alumina or an organic insulator. The insulating layer 212 can have a minimum thickness to prevent damage to the first assembly electrode 201 and the second assembly electrode 202 when the semiconductor light emitting device 150 is assembled, and it can have a maximum thickness for the semiconductor light emitting device 150 being stably assembled.

A barrier wall 207 can be formed on the insulating layer 212. A portion of the barrier wall 207 can be positioned on the first assembly electrode 201 and the second assembly electrode 202, and the remaining area can be positioned on the assembly substrate 200.

On the other hand, when the assembly substrate 200 is manufactured, a portion of the barrier walls formed on the entire upper portion of the insulating layer 212 is removed, an assembly hole 203 in which each of the semiconductor light emitting devices 150 is coupled and assembled to the assembly substrate 200 can be formed.

An assembly hole 203 to which the semiconductor light emitting devices 150 are coupled is formed in the assembly substrate 200, and a surface on which the assembly hole 203 is formed can be in contact with the fluid 1200. The assembly hole 203 can guide an accurate assembly position of the semiconductor light emitting device 150.

Meanwhile, the assembly hole 203 can have a shape and size corresponding to the shape of the semiconductor light emitting device 150 to be assembled at the corresponding position.

Accordingly, it is possible to prevent assembly of other semiconductor light emitting devices or a plurality of semiconductor light emitting devices into the assembly hole 203.

Referring back to FIG. 6, after the assembly substrate 200 is disposed in the chamber, the assembly device 1100 for applying a magnetic field can move along the assembly substrate 200. The assembly device 1100 can be a permanent magnet or an electromagnet.

The assembly device 1100 can move while in contact with the assembly substrate 200 in order to maximize the area applied by the magnetic field into the fluid 1200. According to an embodiment, the assembly device 1100 can include a plurality of magnetic materials or a magnetic material having a size corresponding to that of the assembly substrate 200. In this case, the moving distance of the assembly device 1100 can be limited within a predetermined range.

The semiconductor light emitting device 150 in the chamber 1300 can move toward the assembly device 1100 and the assembly substrate 200 by the magnetic field generated by the assembly device 1100.

Referring to FIG. 7, while moving toward the assembly device 1100, the semiconductor light emitting device 150 can enter into the assembly hole 203 and be fixed by a dielectrophoretic force (DEP force) generated by an electric field of an assembly electrode of an assembly substrate.

Specifically, the assembly wirings 201 and 202 can form an electric field by an AC power source, and a dielectrophoretic force can be formed between the assembly wirings 201 and 202 by this electric field. The semiconductor light emitting device 150 can be fixed to the assembly hole 203 on the substrate 200 by this dielectrophoretic force.

At this time, a predetermined solder layer is formed between the light emitting device 150 and the assembly electrode assembled on the assembly hole 203 of the substrate 200 to can improve the bonding force of the light emitting device 150.

Further, a molding layer can be formed in the assembly hole 203 of the assembly substrate 200 after assembly.

The molding layer can be a transparent resin or a resin containing a reflective material or a scattering material.

By the self-assembly method using the electromagnetic field described above, the time required for each of the semiconductor light emitting devices to be assembled on the substrate can be rapidly reduced, so that a large area high-pixel display can be implemented more quickly and economically.

Next, FIG. 8A is an assembly substrate structure according to an embodiment, and FIG. 8B is an exemplary view of a semiconductor light emitting device disposed on the assembly substrate structure according to FIG. 8A.

Further, FIG. 8C is an exemplary view of the assembly hole shown in FIG. 8A.

In the embodiment, the assembly hole of the substrate can have a shape and size corresponding to the shape of the semiconductor light emitting device to be assembled at the corresponding position. Accordingly, it is possible to prevent assembly of other semiconductor light emitting devices or a plurality of semiconductor light emitting devices into the assembly hole.

Further, according to undisclosed internal technology, simultaneous assembly of R micro-LED chip, G micro-LED chip, and B LED chip using dielectrophoresis is being researched.

However, in order to accurately assemble the R, G, and B LED chips into corresponding assembly holes, research is being conducted on the chip shape exclusiveness of making the horizontal sectional shapes of the R, G, and B LED chips different.

For example, referring to FIG. 8A, the assembly substrate structure 200A1 according to the embodiment can include a plurality of first assembly electrodes 201 and second assembly electrodes 202 spaced apart from each other.

Further, the embodiment can include a barrier wall 207 disposed on each of the assembly electrodes 201 and 202.

The barrier wall 207 can include a first assembly hole 203*a*, a second assembly hole 203*b*, and a third assembly hole 203*c*, some of which are removed in consideration of the shape of the light emitting device to be assembled. The insulating layer 212 can be exposed by the first assembly hole 203*a*, the second assembly hole 203*b*, and the third assembly hole 203*c*.

The horizontal cross section of the first assembly hole 203*a* can be circular, and the horizontal cross sections of the second assembly hole 203*b* and the third assembly hole 203*c* can be elliptical.

Referring to FIG. 8B, the first semiconductor light emitting device 150R, the second semiconductor light emitting device 150G, and the third semiconductor light emitting device 150B can be assembled into each of the first assembly hole 203*a*, the second assembly hole 203*b* and the third assembly holes 203*c*. The first semiconductor light emitting device 150R can be an R LED chip, the second semiconductor light emitting device 150G can be a G LED chip, and the third semiconductor light emitting device 150B can be a B LED chip.

The horizontal cross section of the first assembly hole 203*a* can be circular, and the horizontal cross sections of the second assembly hole 203*b* and the third assembly hole 203*c* can be elliptical.

Specifically, referring to FIG. 8C, the first assembly hole 203*a* can have a first width a1 in the first direction based on the first axis 1st and a first width b1 in the second direction based on the second axis 2nd perpendicular to the first axis, and the first width a1 in the first direction and the first width b1 in the second direction can be the same, but are not limited thereto.

Next, the second assembly hole 203*b* can have a second width a2 in the first direction and a second width b2 in the second direction, and the third assembly hole 203*c* can have a third width a3 in the first direction and a third width b3 in the second direction.

For example, the first assembly hole 203*a* can have a circular cross section in which a first width a1 in the first direction and a first width b1 in the second direction are each 38 μm.

At this time, the second assembly hole 203*b* and the third assembly hole 203*c* can have a predetermined exclusion interval with respect to the first assembly hole 203*a*. For example, the second assembly hole 203*b* and the third assembly hole 203*c* can have a long axis, example, a width in the first direction, increase, and a minor axis example, a width in the first direction, decrease at an exclusive interval with respect to the first assembly hole 203*a*. The exclusion interval can be about 5 μm to 10 μm, but is not limited thereto.

For example, when the first assembly hole 203*a* has a circular cross-section in which the first width a1 in the first direction and the first width b1 in the second direction are 38 μm, respectively, and the exclusion interval is 7 μm, the second width a2 of the second assembly hole 203*b* in the first direction can be 45 μm, and the second width b2 of the second direction can be 31 μm.

Further, the third width a3 of the third assembly hole 203*c* in the first direction can be 52 μm, and the third width b3 in the second direction can be 24 μm, but is not limited thereto.

As described above, research has recently been conducted on the adoption of micro-LED displays for 4K and 8K UHD (Ultra High Definition) TVs, VR, AR, and XR.

A size of 20 μm or less, for example, 10 μm or less, is required for a micro-LED used in such a UHD TV, VR, AR, XR, etc.

However, in internal technology, in order to secure exclusivity, which is the interval between the shape differences between R, G, and B LED chips, internal technology is researching that the size of the standard round-shaped chip should be at least 42 μm in order to implement the remaining two elliptical-shaped chips exclusively.

Accordingly, according to the internal technology, in order to secure the exclusivity of shape among the R, G, B LED chips, the size of the R, G, B LED chips cannot be reduced to less than 42 μm.

There is an urgent need to develop micro-LED size and DEP assembly technology that can be used in UHD TV, VR, AR, XR, etc.

Accordingly, one of the technical objects of the embodiment is to provide an assembly substrate of semiconductor light emitting device and display device including the same that can increase the assembly probability of micro-LED size R, G, B LED chips that can be used in UHD TV, VR, AR, XR, etc, capable of self-emitting of R, G, B colors by ensuring exclusiveness among R, G, B LED chips Further, according to the internal technology, the R-chip is made of AlGaInP material, and the G and B-chips are made of GaN material.

Therefore, since the R-chip and the G, B-chip are heterogeneous materials, it is being studied that the difference in DEP force inevitably occurs.

Accordingly, one of the technical objects of the embodiment is to overcome the difficulty of simultaneous assembly rate of R, G, and B LED chips because G, B LED chips and R chips are heterogeneous materials, and there is a difference in dielectric constant and electrical conductivity, resulting in a difference in DEP force, making it difficult to control the DEP force.

Further, one of the other technical objects of the embodiment is to increase DEP selectivity for LED chips for each color in a self-assembly method using dielectrophoresis (DEP).

Other problem of the embodiment is to provide an assembly substrate of a semiconductor light emitting device capable of increasing assembly probability and a display device including the same.

Hereinafter, specific features of an embodiment for solving the technical problem of the present invention will be described in detail with reference to the drawings.

FIG. 9A is a plan view of the first display device 300N1 equipped with the semiconductor light emitting device package 200N1 for display pixels according to the first embodiment.

FIG. 9B is a cross-sectional view taken along line C1-C2 of the semiconductor light emitting device package 200N1 for a display pixel according to the first embodiment shown in FIG. 9A. (Hereinafter, 'first embodiment' will be abbreviated as 'embodiment')

Referring to FIG. 9A, a first display device 300N1 according to an embodiment can configure one pixel P by including the semiconductor light emitting device package 200N1 for a display pixel and the semiconductor light emitting device 170N of the third color.

The semiconductor light emitting device package 200N1 for the display pixel can be a first color semiconductor light emitting device package and a second color semiconductor light emitting device package.

In the embodiment, the first color and second color semiconductor light emitting device package 200N1 can be a form in which the second color semiconductor light emitting device 130N of the second material is disposed on the first color semiconductor light emitting device 110N of the first material.

For example, in the embodiment, the first color and second color semiconductor light emitting device package 200N1 can be a form in which the second color semiconductor light emitting device 130N of the second material is disposed on the first color semiconductor light emitting device 110N of the first material. For example, the semiconductor light emitting device package 200N1 of the first color and the second color can have a structure in which a red LED chip made of a GaAs material is disposed on a green LED chip made of a GaN material, but is not limited thereto.

Further, in an embodiment, the third color semiconductor light emitting device 170N can be a third color semiconductor light emitting device chip made of a first material. For example, the third color semiconductor light emitting device 170N can be a Blue LED chip made of a GaN material, but is not limited thereto.

The first color semiconductor light emitting device 110N can be electrically connected to the first-first wire 135 after the first-first pad area 141P is opened.

The first-first pad area 141P can be plural, and the first-first wiring 135 can be plural, but is not limited thereto.

The second color semiconductor light emitting device 130N can be electrically connected to the second-first wire 145 after the second-first pad area 136 is opened.

The third color semiconductor light emitting device 170N can be electrically connected to the third-first wire 175 after the third-first pad area 171 is opened.

Referring to FIG. 9B, a semiconductor light emitting device package 200N1 for a display pixel according to an embodiment can include a first color semiconductor light emitting device 110N having a first material and a second color semiconductor light emitting device 130N having a second material disposed thereon.

The second color semiconductor light emitting device 130N can be disposed at an inner central portion of the first color semiconductor light emitting device 110N.

Although the first color semiconductor light emitting device 110N and the second color semiconductor light emitting device 130N are shown as a vertical structure, but are not limited thereto and can have a horizontal structure.

The first color semiconductor light emitting device 110N can include a first semiconductor light emitting structure 101F, a first-first electrode 141, a first-second electrode layer 142, a first insulating layer 111, a first passivation layer 113, a first-first metal layer 121*b*, and a second-first metal layer 122*b*.

The first semiconductor light emitting structure 101F can include a first conductivity type first-first semiconductor layer 101F1, a second conductivity type first-second semiconductor layer 101F2, and a first active layer 101F3 disposed therebetween.

The first-first electrode 141 can be electrically connected to the first-first semiconductor layer 101F1 of the first conductivity type.

The first-second electrode layer 142 can be electrically connected to the second conductivity type first-second semiconductor layer 101F2.

In particular, the first-second electrode layers 142 are electrically connected to the second color semiconductor light emitting device 130N1, so that the first-second electrode layers 142 can function as a lower common electrode.

The first-first metal layer 121*b* and the second-first metal layer 122*b* can include reflective metal layers to increase luminance.

Referring again to FIGS. 9A and 9B together, the first color and second color semiconductor light emitting device packages 200N1 according to the embodiment can have a form in which a second color semiconductor light emitting device 130N having a second material is disposed on a first color semiconductor light emitting device 110N having a first material.

The third color semiconductor light emitting device 170N can be a third color semiconductor light emitting device chip made of a first material.

For example, in the embodiment, the first color semiconductor light emitting device package 200N1 of the second color can have a form in which a red semiconductor light emitting device made of GaAs material is disposed on a blue semiconductor light emitting device made of GaN material. Further, the third color semiconductor light emitting device 170N can be a Blue LED chip made of a GaN material, but is not limited thereto.

Accordingly, according to the embodiment, since the Green LED functioning as the package body is a GaN material, and the remaining Blue LEDs are also a GaN material, there is no difference in permittivity and electrical conductivity even when assembling green-red LED packages and blue LEDs based on the homologous substances, so there is a special technical effect that can precisely control the DEP force when assembling R, G, and B LED chips simultaneously.

Further, according to the embodiment, the number of cases of exclusivity can be reduced by using two shapes having different outer shapes, for example, a combination of a first elliptical and a second elliptical or a first circle and a first elliptical. Accordingly, it is possible to provide an ultra-compact G-R LED package that is less than 30 μm and capable of simultaneous or sequential assembly of R, G, and B, and a display panel structure of a B-chip structure, thereby dramatically reducing the size of the pixel (P) there is a technical effect.

Specifically, in the LED package of the first color and the second color and the LED chip of the third color based on the homologous substances, the outer shapes of the first color and second color LED packages and the third color LED chip can be two different shapes. The number of cases of exclusivity is reduced to two, it is possible to provide the LED package of the first color and the second color is smaller than 30 um and can be assembled simultaneously or sequentially with R, G, and B and a display panel structure with a third color LED chip structure, so that the pixel size can be drastically reduced and the assembly speed can be remarkably improved.

For example, if the subminiature first color and second color LED packages and the third color LED chip structure of the embodiment are applied, when the size of the LED package of the first color and the second color is about 24 to 30 μm, the size of the LED chip of the third color can be controlled to about 18 to 36 μm.

The first color and second color LED packages can have a first circular shape or a first elliptical shape, but are not limited thereto. The third color LED chip structure can have a second elliptical shape or a second circular shape, but is not limited thereto.

Through this, according to the embodiment, exclusivity among R, G, and B LED chips can be secured even though it is a micro-LED size that can be employed in UHD TV, VR, AR, XR, etc.

Accordingly, there is a special technical effect capable of increasing the assembly probability of R, G, and B LED chips capable of self-emission of R, G, and B colors.

Referring to FIGS. 10A to 22 below, a manufacturing process and technical features of the semiconductor light emitting device package 200N1 for display pixels and the first semiconductor light emitting device display device 300N1 including the semiconductor light emitting device package 200N1 according to the first embodiment according to embodiments will be described in detail.

According to the first embodiment, a second color semiconductor light emitting device 130N made of AlGaInP material, for example, an R-chip, is assembled on the first substrate 101, for example, a GaN substrate, the first substrate 101 can be etched to form a first color semiconductor light emitting device 110N, for example, a G-chip.

Accordingly, a composite semiconductor light emitting device package of heterogeneous materials according to the first embodiment in which the second color semiconductor light emitting device 130N of the heterogeneous materials is disposed on the first color semiconductor light emitting device 110N can be formed.

Then, by simultaneously assembling the composite semiconductor light emitting device package 200N1 of heterogeneous materials according to the first embodiment and the semiconductor light emitting device 170N of the third color, for example, a B-chip, an example in which three-color LED chips of R, G, and B chips are simultaneously assembled will be described.

However, the embodiment is not limited thereto.

First, referring to FIG. 10A, a first recess R1 can be formed on the first substrate 101, and a first insulating layer 111 can be formed.

The first substrate 101 can be a GaN substrate, but is not limited thereto. The first insulating layer 111 can be formed of a single layer or multiple layers of an inorganic insulator or an organic insulator such as oxide, nitride, silica, or alumina, but is not limited thereto.

Next, as shown in FIG. 10B, a metal layer 120 can be formed on the first insulating layer 111. The metal layer 120 can function as a post-assembly electrode in a subsequent process. The metal layer 120 can include a first metal layer 121 and a second metal layer 122 spaced apart from each other.

The metal layer 120 can have excellent electrical conductivity. Further, the metal layer 120 can have excellent reflectivity. The metal layer 120 can include at least one of Al, Ag, Ni, Cr, Ti, Al, Rh, Pd, Ir, Ru, Mg, Zn, Pt, Au, Hf, or Cu, is not limited to this.

Next, as shown in FIG. 10C, a second insulating layer 112 can be formed on the metal layer 120. The second insulating layer 112 can be formed of a single layer or multiple layers of an inorganic insulator or an organic insulator such as oxide, nitride, or alumina, but is not limited thereto.

The second insulating layer 112 can serve to protect the metal layer 120.

Further, an electrical short between the second color semiconductor light emitting device 130N and the metal layer 120 to be assembled later can be prevented by the second insulating layer 112.

Next, as shown in FIG. 11A, a semiconductor light emitting device 130N of a second color can be disposed on the metal layer 120 of the first recess R1.

The second color semiconductor light emitting device 130N can be a red LED chip made of AlGaInP material, but is not limited thereto. A horizontal cross section of the second color semiconductor light emitting device 130N can be circular, but is not limited thereto.

The second color semiconductor light emitting device 130N can be assembled to the first recess (R1) by self-assembly using DEP force according to an internal technology using the first metal layer 121 and the second metal layer 122, but is not limited thereto. In another embodiment, the second color semiconductor light emitting device 130N can be assembled on the first recess R1 by a stamping method.

For example, as shown in FIG. 11A, the first substrate 101 provided with the first metal layer 121 and the second metal layer 122 can be disposed in a predetermined fluid chamber, and the second color semiconductor light emitting device 130N can be assembled on the first recess R1 using magnetic force and electric force. For example, the second color semiconductor light emitting device 130N can be assembled with DEP force by using the first metal layer 121 and the second metal layer 122 as assembly electrodes.

After the second color semiconductor light emitting device 130N is assembled, it can be temporarily fixed by forming a coating layer with the first fixing material layer 30*b*, for example, a polymer spray.

The coating layer of the first fixing material layer 30*b* can be removed after exposure, and the remaining first fixing material layer 30*b* can serve to fix the chip between the back surface of the second color semiconductor light emitting device 130N and the first substrate 101.

Next, FIG. 11B is a detailed cross-sectional view of the second color semiconductor light emitting device 130N in the embodiment.

The second color semiconductor light emitting device 130N can be a red-LED chip emitting red color, but is not limited thereto.

For example, the second color semiconductor light emitting device 130N can include a second light emitting structure 131, a second passivation layer 137 disposed on the second light emitting structure 131, and a second-second electrode layer 133 disposed below the second light emitting structure 131.

For example, the second light emitting structure 131 can include a first conductivity type second-first semiconductor layer 131*a*, a second conductivity type second-second semiconductor layer 131*c* and a second active layer 131*b*. The first conductivity type second-first semiconductor layer 131*a* and the second conductivity type second-second semiconductor layer 131*c* can be formed by implanting a first conductivity type dopant and a second conductivity type dopant on GaAs. The second light emitting structure 131 can be formed based on InGap, AlInGaP, or AlInP also to GaAS.

The second-second electrode layer 133 can include at least one of Cu, Ag, Ni, Cr, Ti, Al, Rh, Pd, Ir, Ru, Mg, Zn, Pt, Au, or Hf having excellent electrical conductivity, but not limited to this.

Next, as shown in FIG. 11C, the second insulating layer 112 outside the first recess R1 can be removed, and the exposed metal layer 120 can also be removed.

For example, the sidewall of the first recess R1 and the metal layer 120 positioned on the upper surface of the first substrate 101 can be removed.

Accordingly, the second insulating layer 112, the first-first metal layer 121*b*, and the second-first metal layer 122*b* can be disposed below the second color semiconductor light emitting device 130N.

A manufacturing process of the first color semiconductor light emitting device 110N using the first substrate 101 on which the second color semiconductor light emitting device 130N is assembled will be described with reference to FIGS. 12 to 20C.

Referring to FIG. 12, in the state of FIG. 11C, a portion of the first insulating layer 111 around the second color semiconductor light emitting device 130N can be removed to expose a portion of the upper surface of the first substrate 101.

The exposed upper surface of the first substrate 101 can be partially etched, and a second recess R2 can be formed.

A depth of the second recess R2 can be lower than a depth of the first recess R1.

The first substrate 101 can be in a state in which the above-described first semiconductor light emitting structure 101F is formed through an epitaxial process.

The first semiconductor light emitting structure 101F can include a first conductivity type first-first semiconductor layer 101F1, a second conductivity type first-second semiconductor layer 101F2 and a first active layer 101F3 disposed therebetween.

The second conductivity type first-second semiconductor layer 101F2 can be exposed by the second recess R2, but is not limited thereto.

Next, referring to FIG. 13*a* (cross-sectional view) and FIG. 13*b* (plan view), the mesa area M can be formed through a full ISO process in which a portion of the first substrate 101 exposed by the second recess R2 is removed.

The depth of the mesa area M can be greater than that of the first recess R1.

In the first semiconductor light emitting structure, the first conductivity type first-first semiconductor layer 101F1, the first active layer 101F3 and the second conductive type first-second semiconductor layer 101F2 can be sequentially etched and removed by the mesa area M.

The first substrate 101 can be divided into a first substrate area 101A and a second substrate area 101B by the mesa area M.

In the subsequent process, when the second substrate area 101B is separated based on the mesa area M, the inner first substrate area 101A can be made of the first color semiconductor light emitting device 110N.

For example, when the second substrate area 101B is separated based on the mesa area M, the inner first substrate area 101A can function as the first semiconductor light emitting structure 101F.

Next, referring to FIG. 14A (cross-sectional view) and FIG. 14B (plan view), a first-first electrode 141 can be formed on the first substrate area 101A exposed by the second recess R2.

The first-first electrode 141 can function as an electrode for applying power to the first-first semiconductor layer 101F1 of the first conductivity type of the semiconductor light emitting device 110N of the first color to be manufactured later.

For example, the first-first electrode 141 can function as an n-type electrode or a p-type electrode for applying power to the first active layer of the first color semiconductor light emitting device 110N to be manufactured later, but is not limited thereto.

Next, as shown in FIG. 15A, the first passivation layer 113 can be formed on the entire upper surface of the first substrate 101 in the state of FIG. 14B.

The first passivation layer 113 can be formed of a single layer or multiple layers of an inorganic insulator or an organic insulator such as oxide, nitride, or alumina, but is not limited thereto.

After that, as shown in FIG. 15B, the first passivation layer 113 is partially removed to open the first-first pad area 141P of the first color semiconductor light emitting device and the second-first pad area 130P of the second color semiconductor light emitting device. A predetermined second-first electrode can be exposed on the second color semiconductor light emitting device 130N by opening the second-first pad area 130P, but is not limited thereto.

Meanwhile, the opening process of the first-first pad area 141P and the second-first pad area 130P can be performed in a later process.

Next, as shown in FIG. 16, a first sacrificial layer 113 can be formed on the first passivation layer 113.

The first sacrificial layer 113 can be formed by depositing a metal material including Al or an insulating material, but is not limited thereto.

Next, as shown in FIG. 17, after combining the first dummy substrate 115 with the first sacrificial layer 113, the mesa area M can be exposed by removing the lower side 101C of the upper side 101D of the first substrate and the lower side 101C of the first substrate.

For example, as shown in FIG. 18A, after bonding the first dummy substrate 115 and the first sacrificial layer 113, the lower side 101C of the upper side 101D of the first substrate and the lower side 101C of the first substrate can be removed by the LLO process or method using a laser, but is not limited thereto.

As a method of removing the lower side 101C of the first substrate, an electrochemical etching process or a wet etching process can be employed also to LLO.

Through this, the upper side 101D of the first substrate can be divided into an active area 101F of the first substrate and an outer area 101E of the first substrate.

The active area 101F of the first substrate can be a light emitting area corresponding to the first light emitting structure, and the outer area 101E of the first substrate can be an area to be removed.

Next, as shown in FIG. 18B, the lower side of the first substrate 101C can be removed in a state in which the first dummy substrate 115 is coupled.

Accordingly, the remaining active area 101F of the first substrate and the outer area 101E of the first substrate can be additionally etched to expose the first recess R1.

Next, as shown in FIG. 19, the first-second electrode layer 142 can be formed by forming a metal layer on the exposed second-second electrode layer 133 of the second color semiconductor light emitting device 130N and the lower surface of the first substrate 101.

The first-second electrode layer 142 can function as a common wiring between the first color semiconductor light emitting device 110N and the second color semiconductor light emitting device 130N, but is not limited thereto.

Next, as shown in FIG. 20A, the first dummy substrate 115 can be removed by removing the first sacrificial layer 113.

Accordingly, a heterogeneous material composite semiconductor light emitting device package 200N1 including the second color semiconductor light emitting device 130N mounted on the first color semiconductor light emitting device 110N can be manufactured.

FIG. 20B is a cross-sectional view taken along line C1-C2 of the composite semiconductor light emitting device package 200N1 of heterogeneous materials shown in FIG. 20A.

FIG. 20C is a detailed view of the first epitaxial layer light emitting structure 101F in the heterogeneous materials composite semiconductor light emitting device package 200N1 according to the first embodiment shown in FIG. 20B.

First, referring to FIG. 20B, the composite semiconductor light emitting device package 200N1 of heterogeneous materials according to the first embodiment can include a semiconductor light emitting device 130N of a second color mounted on a semiconductor light emitting device 110N of a first color.

The first color semiconductor light emitting device 110N can include a first epitaxial layer light emitting structure 101F. The first epilayer light emitting structure 101F can have a first recess R1 therein.

The first color semiconductor light emitting device 110N can include a first-first electrode 141 and a first-second electrode layer 142 electrically connected to the first light emitting structure 101F of the first epitaxial layer material.

The first color semiconductor light emitting device 110N can include a first-first metal layer 121*b* and a first-second metal layer 122*b* disposed in the first recess R1 of the first light emitting structure 101F of the first epitaxial layer material.

The first-first metal layer 121*b* and the first-second metal layer 122*b* can have excellent reflectivity and can include at least one of Al, Ag, Ni, Cr, Ti, Al, Rh, Pd, Ir, Ru, Mg, Zn, Pt, Au, or Hf, but is not limited thereto.

The first-first metal layer 121*b* and the second-first metal layer 122*b* can include reflective metal layers to increase luminance.

The composite semiconductor light emitting device package 200N1 of heterogeneous materials according to the first embodiment can include the second color semiconductor light emitting device 130N disposed in the first recess R1 of the first light emitting structure 101F of the first color semiconductor light emitting device 110N.

The second color semiconductor light emitting device 130N can include a second light emitting structure 131 made of a material different from that of the first light emitting structure 101F.

For example, the second light emitting structure 131 can be a GaAs-based semiconductor material, and the first light emitting structure 101F can be a GaN-based semiconductor material, but is not limited thereto.

Next, FIG. 20C is a detailed view of the first light emitting structure 101F in the composite semiconductor light emitting device package 200N1 made of heterogeneous materials according to the first embodiment shown in FIG. 20B.

The first light emitting structure 101F of the first epitaxial layer material of the first color semiconductor light emitting device 110N can include a first conductivity type first-first semiconductor layer 101F1 and a second conductivity type first-second semiconductor layer 101F2 and a first active layer 101F3 disposed therebetween.

The first-first semiconductor layer 101F1 can be electrically connected to the first-first electrode 141.

The first-second semiconductor layer 101F2 can be electrically connected to the first-second electrode layer 142.

Next, FIG. 21 a plan view of the first display device 300N1 in which the composite semiconductor light emitting device package 200N1 made of heterogeneous materials and the semiconductor light emitting device 170N of the third color are simultaneously or sequentially assembled on the panel substrate PS according to the first embodiment shown in FIG. 20A.

Next, referring to FIG. 22, a first-first wire 145 electrically connected to the first-first electrode 141 of the first-first pad area of the first color semiconductor light emitting device 110N can be formed. Further, a second-first wire 135 can be formed in the-second-first pad area 136 of the second color semiconductor light emitting device 130N. And a third-first wire 175 of a third pad area of the third color semiconductor light emitting device 170N can be formed.

Through this, it is possible to manufacture the first display device 300N1 including a composite semiconductor light emitting device package of heterogeneous materials.

Referring to FIG. 22, a semiconductor light emitting device package 200N1 of a first color and a second color according to an embodiment can have a form in which a second color semiconductor light emitting device 130N having a second material is disposed on a first color semiconductor light emitting device 110N having a first material.

The third color semiconductor light emitting device 170N can be a third color semiconductor light emitting device chip made of a first material.

For example, in the embodiment, the semiconductor light emitting device package 200N1 of the first color and the second color can have a form in which a red semiconductor light emitting device made of GaAs material is disposed on a blue semiconductor light emitting device made of GaN material, and the third color semiconductor light emitting device 170N can be a Blue LED chip made of a GaN material, but is not limited thereto.

Accordingly, according to the embodiment, since the Green LED functioning as the package body is a GaN material, and the remaining Blue LEDs are also a GaN material, there is no difference in permittivity and electrical conductivity even when assembling green-red LED packages and blue LEDs based on the homologous substances, so there is a special technical effect that can precisely control the DEP force when assembling R, G, and B LED chips simultaneously.

Further, according to the embodiment, the number of cases of exclusivity can be reduced by using two shapes having different outer shapes, for example, a combination of a first elliptical and a second elliptical or a first circle and a first elliptical. Accordingly, it is possible to provide a subminiature G-R LED package that is less than 30 um and capable of simultaneous or sequential assembly of R, G, and B, and a display panel structure of a B-chip structure, thereby dramatically reducing the size of the pixel (P) there is a technical effect.

Specifically, in the LED package of the first color and the second color and the LED chip of the third color based on the homologous substances, the outer shapes of the first color and second color LED packages and the third color LED chip can be two different shapes. The number of cases of exclusivity is reduced to two, it is possible to provide the LED package of the first color and the second color is smaller than 30 um and can be assembled simultaneously or sequentially with R, G, and B and a display panel structure with a third color LED chip structure, so that the pixel size can be drastically reduced and the assembly speed can be remarkably improved.

For example, if the subminiature first color and second color LED packages and the third color LED chip structure of the embodiment are applied, when the size of the LED package of the first color and the second color is about 24 to 30 μm, the size of the LED chip of the third color can be controlled to about 18 to 36 μm.

The first color and second color LED packages can have a first circular shape or a first elliptical shape, but are not limited thereto. The third color LED chip structure can have a second elliptical shape or a second circular shape, but is not limited thereto.

Through this, according to the embodiment, exclusivity among R, G, and B LED chips can be secured even though it is a micro-LED size that can be employed in UHD TV, VR, AR, XR, etc.

Accordingly, there is a special technical effect capable of increasing the assembly probability of R, G, and B LED chips capable of self-emission of R, G, and B colors.

Next, FIG. 23 is a plan view of the second display device 300N2 including a composite semiconductor light emitting device package of heterogeneous materials.

The second display device 300N2 can employ technical features of the first display device 300N1 described above, and hereinafter, main features of the second display device 300N2 will be mainly described.

The second display device 300N2 can be simultaneously or sequentially assembled using the second-first composite semiconductor light emitting device package 200Ma and the second-second composite semiconductor light emitting device package 200Mb made of heterogeneous materials.

The long axis of the second-second composite semiconductor light emitting device package 200Mb can be greater than the long axis of the second-first composite semiconductor light emitting device package 200Ma, but is not limited thereto.

The second-first composite semiconductor light emitting device package 200Ma can include a fifth semiconductor light emitting device 130G5 of a first color of a first epitaxial layer material mounted on a fourth semiconductor light emitting device 110A4 of a second color of a second epitaxial layer material.

Further, the second-second composite semiconductor light emitting device package 200Mb of the heterogeneous material can include a seventh semiconductor light emitting device 130G7 of a third color of a first epitaxial layer material mounted on a sixth semiconductor light emitting device 110A6 of a second color of a second epitaxial layer material.

The first epitaxial layer material can be a GaN-based material.

Further, the second epitaxial layer material can be a GaAs-based material, but is not limited thereto.

A fourth semiconductor light emitting device 110A4 of a second color of the second epitaxial layer material and the sixth semiconductor light emitting device 110A6 of the second color of the second epitaxial layer material can be connected to the second-second wire 145*b* while the second-second pad area 141*b* is open.

Further, a fifth semiconductor light emitting device 130G5 of a first color of the first epitaxial layer material and a third color light emitting device 130G7 of the first epitaxial layer material can be respectively connected to the first-second wire 135*b* and the first-third wire 135*c*, in the state where the first-second pad area 136*b* and the first-third pad area 136*c* are open According to the second display device 300N2, the second-first complex semiconductor light emitting device package 200Ma made of a heterogeneous material can be based on the fourth semiconductor light emitting device 110A4 of the second color of the second epitaxial layer material. Further, the second-second composite semiconductor light emitting device package 200Mb made of a heterogeneous material can also be based on the sixth semiconductor light emitting device 110A6 of the second color of the second epitaxial layer material.

Accordingly, according to the second display device 300N2, as self-assembly proceeds based on the fourth semiconductor light emitting device 110A4 and the sixth semiconductor light emitting device 110A6 based on the second epitaxial layer material, there is a special technical effect that the DEP force can be balanced.

Next, FIG. 24 is a plan view of the third display device 300N3 including a composite semiconductor light emitting device package of heterogeneous materials.

The third display device 300N3 can employ technical features of the first display device 300N1 or the second display device 300N2 described above.

Hereinafter, main features of the third display device 300N3 will be mainly described.

The third display device 300N3 can employ a horizontal light emitting device chip.

For example, the third display device 300N3 can include a composite third semiconductor light emitting device package 200N3 made of heterogeneous materials and a third-second semiconductor light emitting device 130N3.

The third semiconductor light emitting device package 200N3 can include a third-second semiconductor light emitting device 130N3 of a second color mounted on a third-first semiconductor light emitting device 110N3 of a first color.

The third-first semiconductor light emitting device 110N3 of the first color can include a first light emitting structure of a first epitaxial layer material. The third-second semiconductor light emitting device 130N3 of the second color can include a second light emitting structure made of a second epitaxial layer material. The third-third semiconductor light emitting device 170N3 of the third color can include a third light emitting structure made of a first epitaxial layer material.

The third semiconductor light emitting device package 200N3 can include a third-first common wiring 155 commonly connected to the third-first semiconductor light emitting device 110N3 of the first color and the third-second semiconductor light emitting device 130N3 of the second color. For example, the third-first common wiring 155 can function as a common wiring electrically connected to the third-first semiconductor light emitting element 110N3 of the first color and the n-type semiconductor layer or the p-type semiconductor layer of the third-second semiconductor light emitting element 130N3 of the second color, through the third-first pad area 150P.

Next, the third-third semiconductor light emitting device 170N3 of the third color can include a third-third wire 185 electrically connected to the n-type semiconductor layer or the p-type semiconductor layer of the third light emitting structure through the third-third pad area 180P.

Through this, the third display device 300N3 can implement the same technical features as the first display device 300N1 or the second display device 300N2 described above while employing a horizontal light emitting device chip.

On the other hand, since G, B LED chips and R chips are heterogeneous materials, differences in dielectric constant and electrical conductivity can occur.

However, according to the embodiment, there is a technical effect that can solve the difficulty of controlling the DEP force during simultaneous assembly of R, G, and B LED chips.

Especially, according to the embodiment, since the Green LED functioning as the package body is a GaN material, and the remaining Blue LEDs are also a GaN material, there is no difference in permittivity and electrical conductivity even when assembling green-red LED packages and blue LEDs based on the homologous substances, so there is a special technical effect that can precisely control the DEP force when assembling R, G, and B LED chips simultaneously.

Further, according to the embodiment, the embodiment can increase the assembly probability of R, G, B LED chips capable of self-emitting of R, G, B colors by securing exclusiveness between R, G, and B LED chips while having a micro-LED size that can be employed in UHD TV, VR, AR, XR, etc.

For example, according to the embodiment, in the LED package of the first color and the second color and the LED chip of the third color based on the homologous substances, the outer shapes of the first color and second color LED packages and the third color LED chip can be two different shapes. The number of cases of exclusivity is reduced to two, it is possible to provide the LED package of the first color and the second color is smaller than 30 um and can be assembled simultaneously or sequentially with R, G, and B and a display panel structure with a third color LED chip structure, so that the pixel size can be drastically reduced and the assembly speed can be remarkably improved.

For example, if the subminiature first color and second color LED packages and the third color LED chip structure of the embodiment are applied, when the size of the LED package of the first color and the second color is about 24 to 30 μm, the size of the LED chip of the third color can be controlled to about 18 to 36 μm.

Further, the first color and second color LED packages can have a first circular shape or a first elliptical shape, but are not limited thereto. The third color LED chip structure can have a second elliptical shape or a second circular shape, but is not limited thereto.

Through this, according to the embodiment, exclusivity among R, G, and B LED chips can be secured even though it is a micro-LED size that can be employed in UHD TV, VR, AR, XR, etc. Accordingly, there is a special technical effect capable of increasing the assembly probability of R, G, and B LED chips capable of self-emission of R, G, and B colors.

Further, according to the display device according to the embodiment, in a self-assembly method using dielectrophoresis (DEP), there is a special technical effect that can simultaneously increase assembly probability while increasing DEP selectivity for LED chips for each color.

The above detailed description should not be construed as limiting in all respects and should be considered as illustrative.

The scope of the embodiments should be determined by reasonable interpretation of the appended claims, and all changes within the equivalent range of the embodiments are included in the scope of the embodiments.

The embodiment can be adopted in the display field for displaying images or information.

The embodiment can be adopted in the display field for displaying images or information using a semiconductor light emitting device.

The embodiment can be adopted in the display field for displaying images or information using micro-level or nano-level semiconductor light emitting devices.

What is claimed is:

1. A semiconductor light emitting device package for display pixels, the semiconductor light emitting device package comprising:

a first semiconductor light emitting device of a first color having a first material;

a second semiconductor light emitting device of a second color having a second material and disposed on the first semiconductor light emitting device of the first color; and a third semiconductor light emitting device of a third color having a third material and disposed on one side of the first semiconductor light emitting device and the second semiconductor light emitting device, wherein the first semiconductor light emitting device of the first color comprises a first semiconductor light emitting structure having an inner recess, and a first-first electrode and a first-second electrode layer electrically connected to a first side and a second side of the first semiconductor light emitting structure, respectively, wherein the second semiconductor light emitting device is disposed in the inner recess of the first semiconductor light emitting device, wherein the second color is different from the first color, wherein the third color is different from the first color and the second color, wherein the first semiconductor light emitting device is electrically connected to a first-first wire, the second semiconductor light emitting device is electrically connected to a second-first wire, and the third semiconductor light emitting device is electrically connected to a third-first wire, and wherein the first semiconductor light emitting device, the second semiconductor light emitting device, and the third semiconductor light emitting device are independently drivable such that each of the first semiconductor light emitting device, the second semiconductor light emitting device, and the third semiconductor light emitting device is configured to be individually turned on or off through the respective first-first wire, second-first wire, and third-first wire.

2. The semiconductor light emitting device package according to claim 1, wherein the first semiconductor light emitting structure of the first semiconductor light emitting device includes a first conductivity type first-first semiconductor layer, a second conductivity type first-second semiconductor layer, and a first active layer disposed therebetween, and wherein the first-first electrode is electrically connected to the first conductivity type first-first semiconductor layer, and the first-second electrode layer is electrically connected to the second conductive type first-second semiconductor layer and the second semiconductor light emitting device.

3. The semiconductor light emitting device package according to claim 1, further comprising a first-first metal layer and a second-first metal layer disposed between the second semiconductor light emitting device and the first semiconductor light emitting device in an electrically insulated state.

4. The semiconductor light emitting device package according to claim 3, wherein the first-first metal layer and the second-first metal layer include a reflective metal layer.

5. The semiconductor light emitting device package according to claim 3, wherein the first-first metal layer and the second-first metal layer vertically overlap the second semiconductor light emitting device.

6. The semiconductor light emitting device package according to claim 3, wherein the first-first metal layer and the second-first metal layer are disposed below the second semiconductor light emitting device.

7. The semiconductor light emitting device package according to claim 1, wherein an upper surface of the second semiconductor light emitting device is positioned higher than an upper surface of the first semiconductor light emitting device.

8. The semiconductor light emitting device package according to claim 1, wherein the first-second electrode layer is contact with a second-second electrode layer of the second semiconductor light emitting device.

9. The semiconductor light emitting device package according to claim 1, wherein the second material is different from the first material, and wherein the third material is a same with the first material.

10. The semiconductor light emitting device package according to claim 1, wherein the first semiconductor light emitting device of the first color is configured to surround the second semiconductor light emitting device of the second color.

11. The semiconductor light emitting device package according to claim 1, wherein a lateral width of the first semiconductor light emitting device of the first color is greater than that of the second semiconductor light emitting device of the second color.

12. The semiconductor light emitting device package according to claim 1, wherein the third semiconductor light emitting device of the third color is spaced apart from the first semiconductor light emitting device of the first color, wherein the first semiconductor light emitting device and the second semiconductor light emitting device form a composite semiconductor light emitting device package, and wherein the third semiconductor light emitting device is provided as a separate light emitting device spaced apart from the composite semiconductor light emitting device package.

13. The semiconductor light emitting device package according to claim 1, wherein the third semiconductor light emitting device of the third color is spaced apart from the second semiconductor light emitting device of the second color, wherein the first semiconductor light emitting device and the second semiconductor light emitting device form a composite semiconductor light emitting device package, and wherein the third semiconductor light emitting device is provided as a separate light emitting device spaced apart from the composite semiconductor light emitting device package.

14. The semiconductor light emitting device package according to claim 1, wherein a portion of the first semiconductor light emitting device of the first color is disposed between the third semiconductor light emitting device of the third color and the second semiconductor light emitting device of the second color.

15. The semiconductor light emitting device package according to claim 1, wherein the second semiconductor light emitting device is seated within an interior of the inner recess.

16. A display device comprising a semiconductor light emitting device package, wherein the semiconductor light emitting device package comprises:

a first semiconductor light emitting device of a first color having a first material;

a second semiconductor light emitting device of a second color having a second material and disposed on the first semiconductor light emitting device of the first color; and a third semiconductor light emitting device of a third color having a third material and disposed on one side of the first semiconductor light emitting device and the second semiconductor light emitting device, wherein the first semiconductor light emitting device of the first color comprises a first semiconductor light emitting structure having an inner recess, and a first-first electrode and a first-second electrode layer electrically connected to a first side and a second side of the first semiconductor light emitting structure, respectively, wherein the second semiconductor light emitting device is disposed in the inner recess of the first semiconductor light emitting device, wherein the second color is different from the first color, wherein the third color is different from the first color and the second color, wherein the first semiconductor light emitting device is electrically connected to a first-first wire, the second semiconductor light emitting device is electrically connected to a second-first wire, and the third semiconductor light emitting device is electrically connected to a third-first wire, and wherein the first semiconductor light emitting device, the second semiconductor light emitting device, and the third semiconductor light emitting device are independently drivable such that each of the first semiconductor light emitting device, the second semiconductor light emitting device, and the third semiconductor light emitting device is configured to be individually turned on or off through the respective first-first wire, second-first wire, and third-first wire.

17. The display device according to claim 16, wherein the first semiconductor light emitting device and the second semiconductor light emitting device form a composite semiconductor light emitting device package, and wherein the third semiconductor light emitting device is provided as a separate light emitting device spaced apart from the composite semiconductor light emitting device package.

* * * * *